US006819617B2

(12) United States Patent
Hwang et al.

(10) Patent No.: US 6,819,617 B2
(45) Date of Patent: Nov. 16, 2004

(54) SYSTEM AND METHOD FOR PERFORMING PARTIAL ARRAY SELF-REFRESH OPERATION IN A SEMICONDUCTOR MEMORY DEVICE

(75) Inventors: Hyong-Ryol Hwang, Seoul (KR); Jong-Hyun Choi, Suwon (KR); Hyun-Soon Jang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/452,176

(22) Filed: Jun. 2, 2003

(65) Prior Publication Data

US 2003/0206427 A1 Nov. 6, 2003

Related U.S. Application Data

(62) Division of application No. 09/925,812, filed on Aug. 9, 2001, now Pat. No. 6,590,822.
(60) Provisional application No. 60/289,264, filed on May 7, 2001.

(51) Int. Cl.[7] .............................. G11C 7/00; G11C 6/00
(52) U.S. Cl. ............. 365/222; 365/230.03; 365/230.06; 365/230.08; 365/233; 365/191; 365/189.08; 365/236
(58) Field of Search .......................... 365/222, 230.06, 365/233, 236, 230.03, 230.09

(56) References Cited

U.S. PATENT DOCUMENTS

| | | | | |
|---|---|---|---|---|
| 4,933,907 A | | 6/1990 | Kumanoya et al. ......... 365/222 |
| 5,430,681 A | * | 7/1995 | Sugawara et al. .......... 365/222 |
| 5,469,559 A | * | 11/1995 | Parks et al. ................ 711/106 |
| 5,511,033 A | | 4/1996 | Jung .......................... 365/222 |
| 5,559,981 A | * | 9/1996 | Racino et al. .............. 711/103 |
| 5,818,777 A | * | 10/1998 | Seyyedy ..................... 365/222 |
| 5,872,903 A | * | 2/1999 | Iwata et al. ................. 713/400 |
| 5,875,143 A | * | 2/1999 | Ben-Zvi ...................... 365/222 |
| 5,966,725 A | * | 10/1999 | Tabo .......................... 711/106 |
| 6,075,744 A | | 6/2000 | Tsern et al. ............. 365/230.03 |
| 6,081,468 A | * | 6/2000 | Taira et al. ................. 365/203 |
| 6,137,742 A | * | 10/2000 | Jung .......................... 365/222 |
| 6,205,046 B1 | * | 3/2001 | Maesako ..................... 365/120 |
| 6,215,714 B1 | | 4/2001 | Takemae et al. ............ 365/222 |
| 6,246,619 B1 | * | 6/2001 | Ematrudo et al. .......... 365/201 |
| 6,341,097 B1 | * | 1/2002 | Hsu et al. ................... 365/222 |
| 6,345,009 B1 | * | 2/2002 | Tsern et al. ................. 365/222 |
| 6,347,063 B1 | * | 2/2002 | Dosaka et al. .............. 365/233 |
| 6,356,484 B2 | * | 3/2002 | Dosaka et al. ......... 365/189.01 |
| 6,381,188 B1 | * | 4/2002 | Choi et al. .................. 365/222 |
| 6,385,125 B1 | * | 5/2002 | Ooishi et al. ............... 365/233 |
| 6,400,593 B1 | * | 6/2002 | Lien et al. .................... 365/49 |
| 6,418,068 B1 | * | 7/2002 | Raynham .................... 365/200 |
| 2002/0054514 A1 | * | 5/2002 | Kajigaya et al. ........ 365/189.02 |
| 2002/0080677 A1 | * | 6/2002 | Watanabe et al. ........... 365/233 |
| 2002/0138690 A1 | * | 9/2002 | Simmonds et al. ......... 711/106 |
| 2003/0021149 A1 | * | 1/2003 | So et al. ................. 365/185.03 |
| 2004/0027902 A1 | * | 2/2004 | Ooishi et al. ............... 365/222 |

FOREIGN PATENT DOCUMENTS

| | | | |
|---|---|---|---|
| EP | 1 074 993 A1 | 7/2001 | ......... G11C/11/406 |
| JP | 06333390 A | * 12/1994 | ......... G11C/11/407 |

* cited by examiner

*Primary Examiner*—David Neims
*Assistant Examiner*—Ly Duy Pham
(74) *Attorney, Agent, or Firm*—F. Chau & Associates LLC

(57) ABSTRACT

Systems and methods for performing a PASR (partial array self-refresh) operation wherein a refresh operation for recharging stored data is performed on a portion (e.g., ½ ¼, ⅛, or ⅟₁₆) of one or more selected memory banks comprising a cell array in a semiconductor memory device. In one aspect, a PASR operation is performed by (1) controlling the generation of row addresses by a row address counter during a self-refresh operation and (2) controlling a self-refresh cycle generating circuit to adjust the self-refresh cycle output therefrom. The self-refresh cycle is adjusted in a manner that provides a reduction in the current dissipation during the PASR operation. In another aspect, a PASR operation is performed by controlling one or more row addresses corresponding to a partial cell array during a self-refresh operation, whereby a reduction in a self-refresh current dissipation is achieved by blocking the activation of a non-used block of a memory bank.

4 Claims, 25 Drawing Sheets

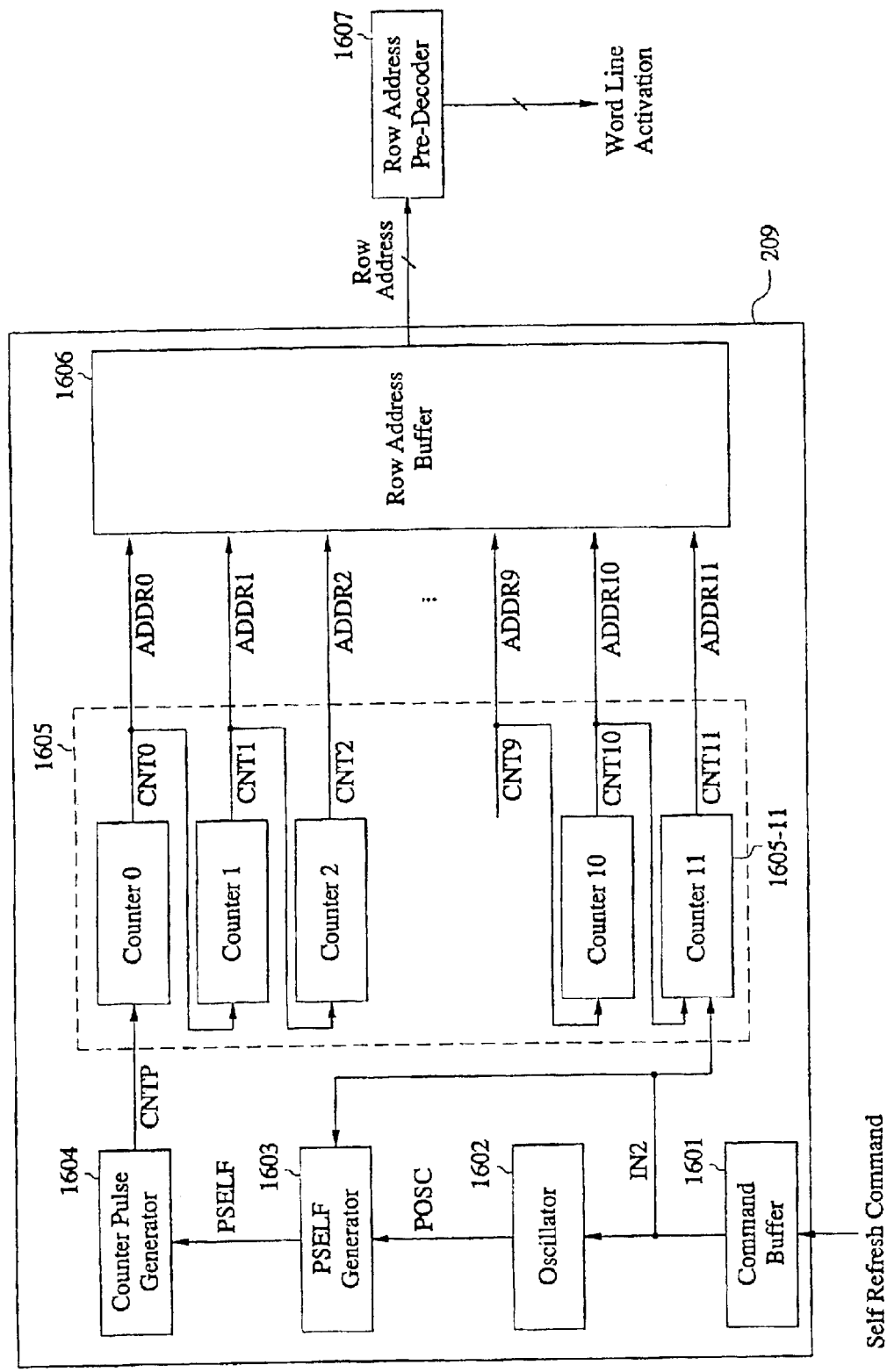

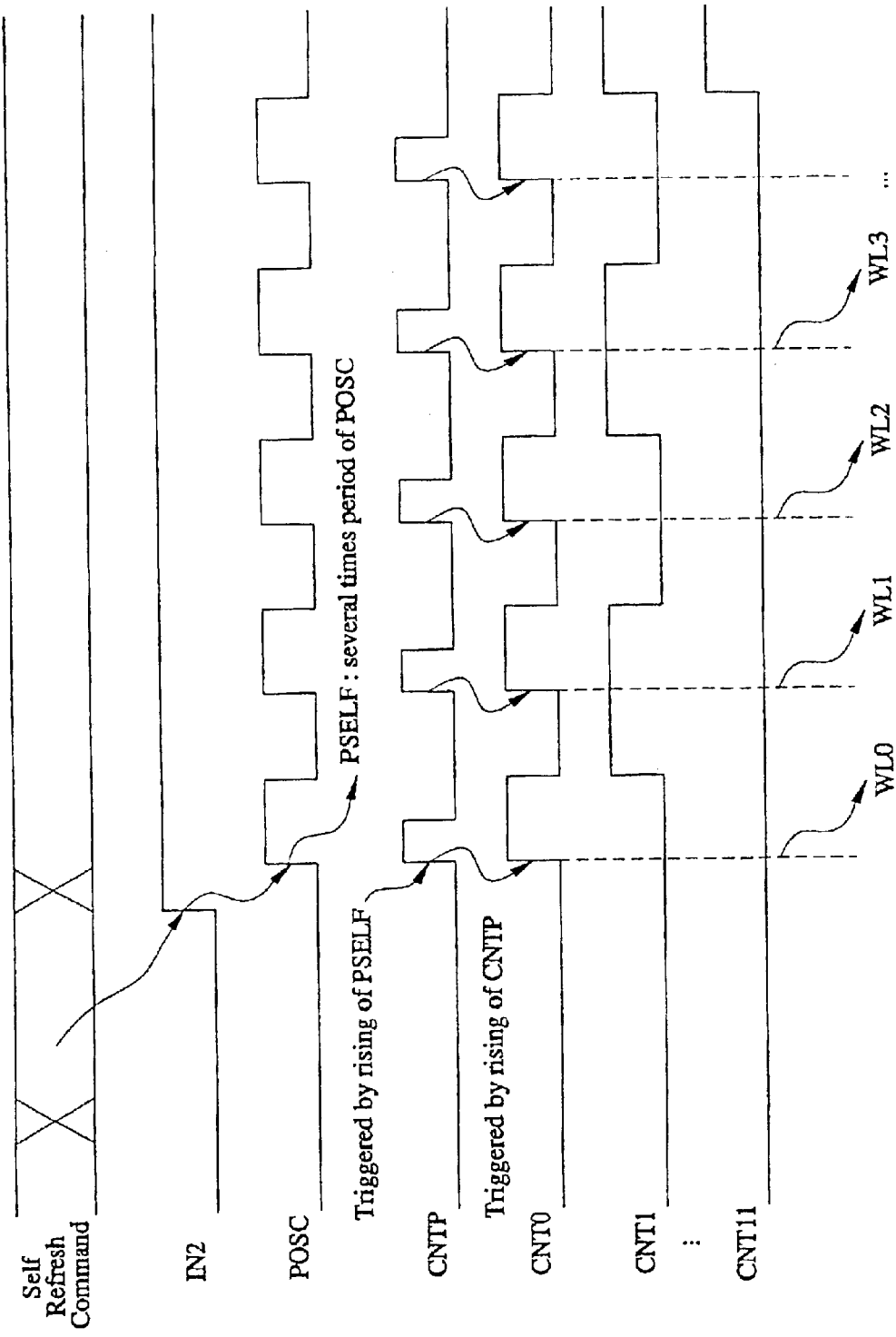

FIG. 23
(a)
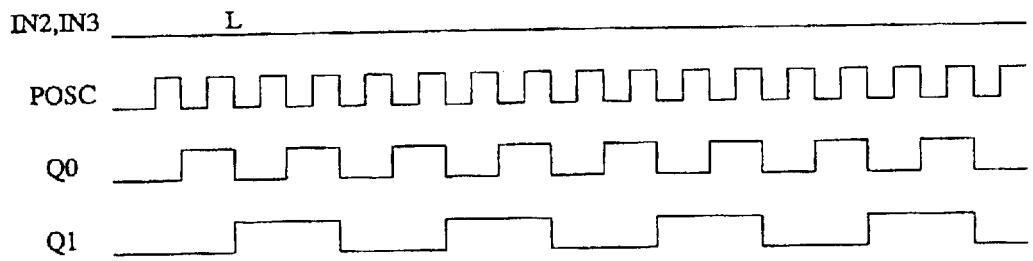
(b)
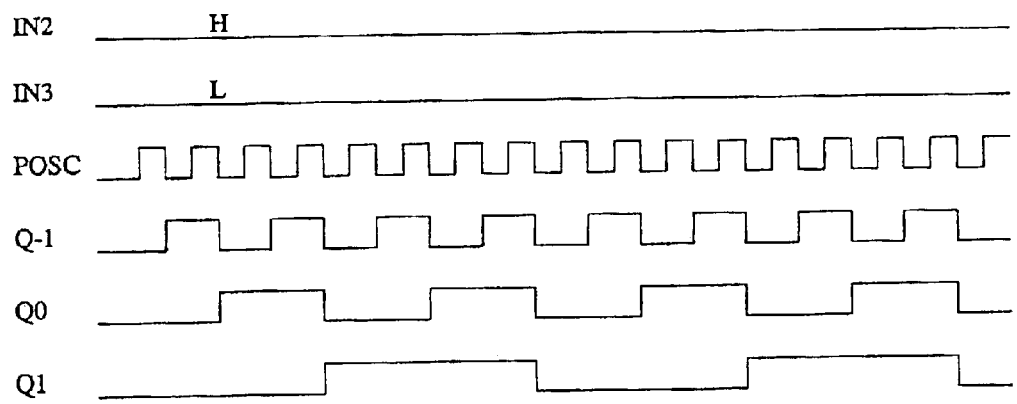
c)
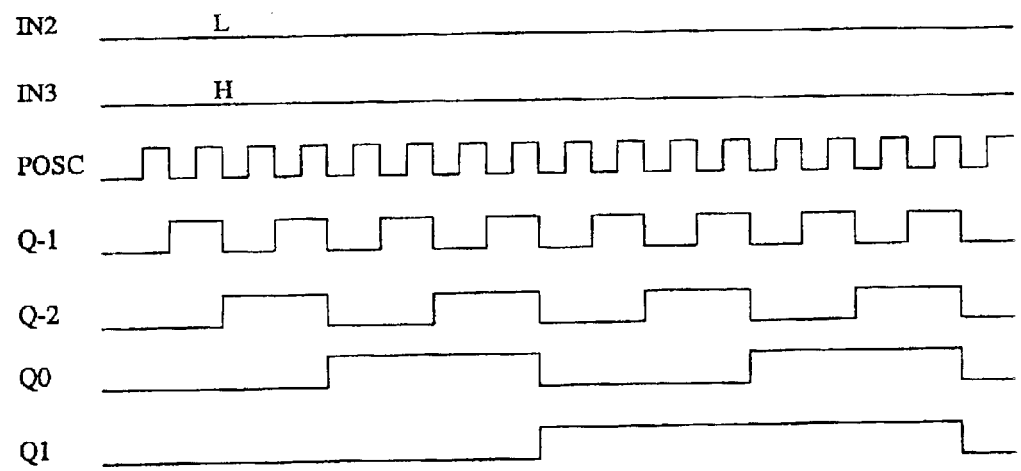

SYSTEM AND METHOD FOR PERFORMING PARTIAL ARRAY SELF-REFRESH OPERATION IN A SEMICONDUCTOR MEMORY DEVICE

CROSS-REFERENCE TO RELATED APPLICATIONS

This application is a Divisional of U.S. application Ser. No. 09/925,812 filed on Aug. 9, 2001 now U.S. Pat. No. 6,590,822, which is based on U.S. Provisional Application No. 60/289,264 filed on May 7, 2001, both of which are fully incorporated herein by reference.

BACKGROUND

1. Technical Field

The present invention relates to semiconductor memory devices such as DRAMs (dynamic random access memory) and, more particularly, to a system and method for performing a PASR (partial array self-refresh) operation, wherein a self-refresh operation for recharging stored data is performed on a portion of one or more selected memory banks comprising a cell array in a semiconductor memory device.

2. Description of Related Art

Semiconductor memory devices are largely classified as dynamic random access memories (DRAM) and static random access memories (SRAM). In an SRAM, a unit cell is implemented by four transistors constituting a latching mechanism. Unless the power is interrupted, the stored data is not volatile. Thus, a refresh operation is not necessary. However, in a DRAM, a unit cell is implemented by one transistor and one capacitor, and data is stored in the capacitor. A capacitor formed on a semiconductor substrate is not necessarily completely isolated from peripheral circuits, and therefore, it is possible for the data stored in the memory cell to be altered due to current leakage. Thus, a refresh operation for periodically recharging the data stored in the memory cell is required. A self-refresh operation of a semiconductor memory device is performed while sequentially varying internal addresses by an externally applied command signal.

According to recent trends in highly integrated, large capacitance semiconductor memory devices, a plurality of memory banks are commonly incorporated within a memory chip. Each memory bank is capable of outputting a predetermined amount of data. DRAMs installed on recent systems, including cordless telephones, data banks, Pentium®-type computer combined personal data assistance (PDA) systems, utilize most memory banks during a data communication mode, while utilizing only specific memory banks for storing data necessary for the system during a standby mode. In order to implement PDA systems, which commonly operate on battery power, it is necessary to minimize power consumption.

FIG. 1 is a block diagram of circuits utilized during a self-refresh operation for a conventional DRAM. In this specification, for the sake of convenience in explanation, a DRAM having four memory banks $101\_i$ (i is an integer from 1 to 4) is illustrated. In FIG. 1, circuit portions related to a self-refresh operation are schematically shown while circuit portions unrelated to the self-refresh operation are not shown.

The respective memory banks $101\_i$ have a plurality of memory cells arranged in columns and rows. Row decoders $103\_i$ define row addresses in the corresponding memory bank. Column decoders $105\_1$ and $105\_2$ define column addresses in the corresponding memory bank. A refresh entry detector 107 detects a signal to enter self-refresh operation, and, in response, generates a refresh instruction signal PRFH. In response to a refresh instruction signal PRFH, an internal address generator and counter 109 spontaneously generates sequential addresses FRA1 to FRAn for a self-refresh operation, with the internal addresses being sequentially varied. A switch 111 receives external addresses A1 to An during a normal operating mode and receives the counting addresses FRA1 to FRAn during a refresh mode, and transfers the same to the row decoders $103\_i$ as internal addresses RA1 to RAn.

The self-refresh operation is executed in the following manner. A semiconductor memory device enters into a self-refresh mode in response to an externally input command signal. Then, row addresses are sequentially increased or decreased at predetermined intervals. Word lines of a memory cell are selected sequentially by varying the row addresses. The charge accumulated in the capacitor corresponding to the selected word line is amplified by a sense amplifier and then stored in the capacitor again. Through such a refresh operation, the stored data is retained without loss. This self-refresh operation consumes a large amount of current during the process of sense-amplifying the data stored in the capacitor.

In the conventional DRAM shown in FIG. 1, a self-refresh operation is performed with respect to all memory banks. In other words, even if data is stored in only a specific memory bank, the self-refresh operation is performed on all memory banks.

Furthermore, although separate internal voltage generators $113\_i$ (i is an integer from 1 to 4), including, for example, a back-bias voltage generator or an internal power-supply voltage generator, generally exist for each memory bank, they are all operated during a refresh operation.

As described above, the conventional DRAM performs a self-refresh operation with respect to all memory banks, resulting in unnecessary current dissipation. Also, if a self-refresh mode is entered, all the internal voltage generators existing for each memory bank operate, thereby further increasing current dissipation.

SUMMARY OF THE INVENTION

To address the above limitations, it is an object of the present invention to provide a semiconductor memory device, such as a dynamic random access memory (DRAM), having a plurality of memory banks, wherein the semiconductor memory device is capable of selectively performing a self-refresh operation with respect to individual memory banks and with respect to a portion of one or more selected memory banks.

The present invention provides various mechanisms for performing a PASR (partial array self-refresh) operation wherein a refresh operation for recharging stored data is performed on a portion of one or more selected memory banks comprising a cell array in a semiconductor memory device. More specifically, the present invention provides mechanisms for performing a PASR operation for, e.g., ½ ¼, ⅛, or ¹⁄₁₆ of a selected memory bank.

In one aspect of the present invention, a PASR operation is performed by (1) controlling the generation of row addresses by a row address counter during a self-refresh operation and (2) controlling a self-refresh cycle generating circuit to adjust the self-refresh cycle output therefrom. The self-refresh cycle is adjusted in a manner that provides a reduction in the current dissipation during the PASR operation.

In another aspect of the present invention, a PASR operation is performed by controlling one or more row addresses corresponding to a partial cell array during a self-refresh operation, whereby a reduction in a self-refresh current dissipation is achieved by blocking the activation of a non-used block of a memory bank.

In yet another aspect of the present invention, a memory device comprises:

a plurality of memory banks each comprising a plurality of memory blocks; and a self-refresh controlling circuit for selecting one of the memory banks and performing a self-refresh operation on one of the memory blocks of the selected memory bank.

In another aspect, a circuit for performing a PASR operation in a semiconductor memory device comprises:

a first pulse generator for generating a self-refresh cycle signal during a refresh operation of a semiconductor memory device, wherein the self-refresh cycle signal comprises a predetermined period T; and a counter comprising a plurality of cycle counters for generating row address data in response to the self-refresh cycle signal, wherein the row address data is decoded to activate wordlines of a memory bank during the refresh operation of the semiconductor memory device, wherein during a PASR operation, the counter is responsive to PASR control signal to disable operation of a cycle counter to mask an address bit output from the counter and wherein the first pulse generator is responsive to the PASR control signal to increase the predetermined period T of the self-refresh cycle signal.

In yet another aspect, a circuit for performing a PASR operation in a semiconductor memory device comprises:

a first pulse generator for generating a self-refresh cycle signal during a refresh operation of a semiconductor memory device;

a counter comprising a plurality of cycle counters for generating row address data in response to the self-refresh cycle signal, wherein the row address data is decoded to activate wordlines of a memory bank during the refresh operation of the semiconductor memory device;

a row address buffer for receiving the row address data output from the counter and outputting row addresses;

a row predecoder for decoding the row addresses output from the row address buffer to generate self-refresh address signals that are processed to activate wordlines of a memory bank during the refresh operation of the semiconductor memory device, wherein during a PASR operation, the row address buffer is responsive to a PASR control signal to mask one or more address bits of the row address data to block activation of wordlines corresponding to a non-used portion of a memory bank.

In another aspect of the present invention, a circuit for performing a PASR operation in a semiconductor memory device comprises:

a first pulse generator for generating a self-refresh cycle signal during a refresh operation of a semiconductor memory device;

a counter comprising a plurality of cycle counters for generating row address data in response to the self-refresh cycle signal, wherein the row address data is decoded to activate wordlines of a memory bank during the refresh operation of the semiconductor memory device;

a row address buffer for receiving the row address data output from the counter and outputting row addresses;

a row predecoder for decoding the row addresses output from the row address buffer to generate self-refresh address signals that are processed to activate wordlines of a memory bank during the refresh operation of the semiconductor memory device, wherein during a PASR operation, the row predecoder is responsive to a PASR control signal to mask one or more address bits of the row address data to block activation of wordlines corresponding to a non-used portion of a memory bank.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 16 is a schematic diagram of a circuit for performing a PASR operation according to an embodiment of the present invention.

FIG. 17 is a timing diagram illustrating control signals that are used for performing a full array self-refresh operation according to one aspect of the present invention.

FIGS. 23(a), (b) and (c) are timing diagrams illustrating various modes of operation of the self-refresh cycle generator of FIG. 22.

DETAILED DESCRIPTION OF PREFERRED EMBODIMENTS

Figure 1:
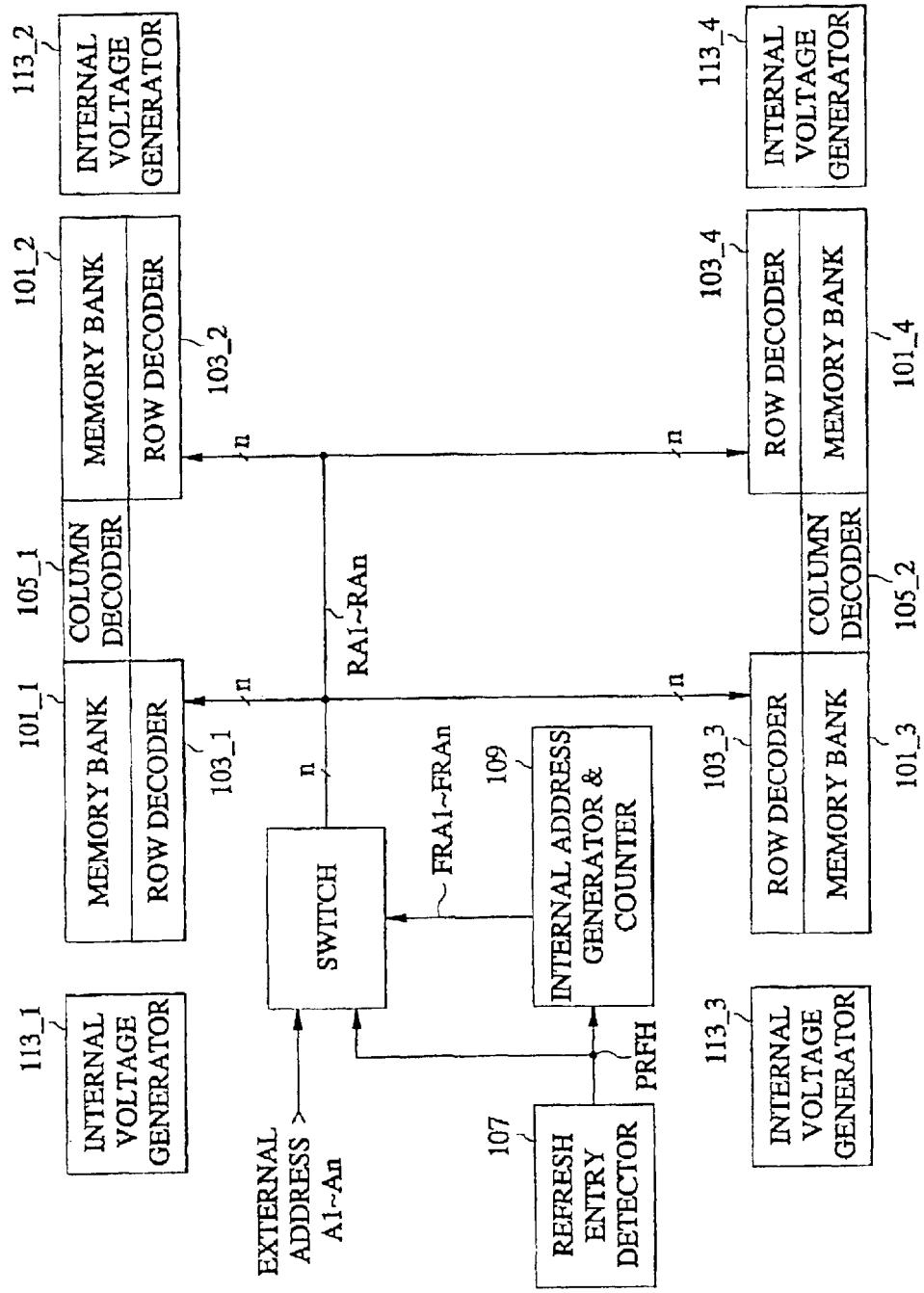
FIG. 1 is a block diagram illustrating circuits related to a refresh operation of a conventional DRAM device.

To fully understand the invention, the operational advantages thereof and the objects accomplished by the invention, preferred embodiments of the present invention will hereinafter be described with reference to the accompanying drawings. The same reference numerals in the respective drawings denote the same elements.

Figure 2:
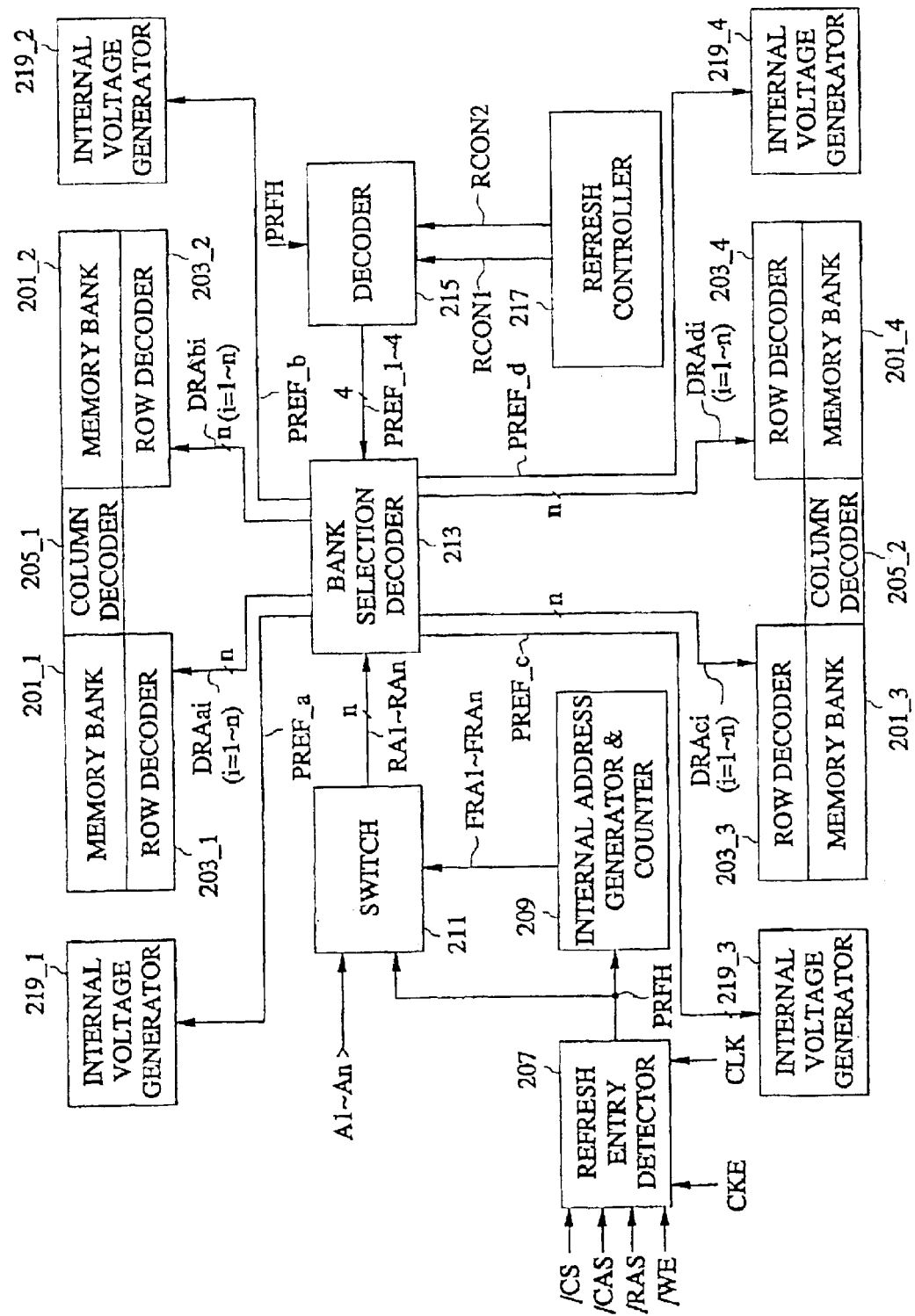
FIG. 2 is a block diagram illustrating circuits related to a refresh operation of a DRAM capable of selectively performing a self-refresh operation for each individual memory bank, according to a preferred embodiment of the present invention.

FIG. 2 is a block diagram illustrating circuits related to a refresh operation of a DRAM capable of selectively performing a self-refresh operation for each memory bank individually, according to a preferred embodiment of the present invention.

Referring to FIG. 2, the DRAM capable of selectively performing a self-refresh operation for each memory bank individually, according to a preferred embodiment of the present invention, includes a plurality of memory banks 201_i. In the specification, for the sake of convenience in explanation, a DRAM having four memory banks 201_i (where i is an integer from 1 to 4) will be described by way of example. The invention is equally applicable to DRAMs having a plurality of memory banks other than four in number.

The respective memory banks 201_i have a plurality of memory cells arranged in columns and rows. Row decoders 203_i designate row addresses in the corresponding memory banks. For example, the row decoder 203_1 selects a row address in the memory bank 201_1.

Column decoders 205_1 and 205_2 designate column addresses in the corresponding memory barks. For example, the column decoder 205_1 selects column addresses in the memory banks 201_1 and 201_2.

In response to entry into a self-refresh mode, a refresh entry detector 207 generates a refresh instruction signal PRFH. In other words, if the self-refresh mode is entered, the refresh instruction signal PRFH is activated to a logic "high" level. The structure and operation of the refresh entry detector 207 will later be described in detail with reference to FIG. 3.

An internal address generator and counter 209 generates a pulse for each predetermined period during a self-refresh operation and generates counting addresses FRA1 to FRAn sequentially increasing in response to the pulses. The combination of the counting addresses FRA1 to FRAn sequentially changes the designated row addresses. A switch 211, activated by the refresh instruction signal PRFH generated in the refresh entry detector 207, receives external addresses A1 to An during operation in a normal mode and receives the counting addresses FRA1 to FRAn during operation in the refresh mode, and, in turn, generates internal addresses RA1 to RAn. The operation of the switch 211 will later be described in detail with reference to FIG. 5.

Referring back to FIG. 2, in addition to the circuits included in the conventional DRAM, the DRAM of the present invention further includes a bank selection decoder 213, a decoder 215 and a refresh controller 217. The decoder 215 and the refresh controller 217 are preferably implemented by a refresh bank designating circuit of the present invention, described below. Also, the bank selection decoder 213, the decoder 215 and the refresh controller 217 can be implemented by a refresh controlling circuit of the present invention, described below The decoder 215 generates first through fourth refresh bank designating signals PREF_i (Here, i is an integer from 1 to 4). Memory banks 201_1 to be refreshed are determined by the first through fourth refresh bank designating signals PREF_1 to PREF_4.

The refresh controller 217 generates refresh control signals RCON1 and RCON2 and supplies the same to the decoder 215. There may be more than the two refresh control signals RCON1 and RCON2. The refresh control signals RCON1 and RCON2 control selection of memory banks to be refreshed. The refresh controller 217 will be described in detail below with reference to FIGS. 6, 7 and 8.

The decoder 215 decodes the refresh control signals RCON1 and RCON2 in a self-refresh mode to generate the first through fourth refresh bank designating signals PREF_1 to PREF_4. The decoder 215 will later be described in detail with reference to FIG. 9.

The bank selection decoder 213 receives the first through fourth refresh bank designating signals PREF_1 to PREF_4 and the internal addresses RA1 to RAn in the self-refresh mode. The bank selection decoder 213 supplies refresh addresses DRAai (where i is an integer from 1 to 4) to the row decoders of the memory banks selected by the first through fourth refresh bank designating signals PREF_1 to PREF_4 and a combination thereof.

For example, in the case where the first memory bank 201_1 (FIG. 2) is selected by the first through fourth refresh bank designating signals PREF_1 to PREF_4 to then be refreshed, the data of the internal addresses RA1 to RAn is supplied as the refresh addresses DRAa1 to DRAa4 to the row decoder 203_1 which selects a row address of the memory cell of the memory bank 201_1. The bank selection decoder 213 will later be described in detail with reference to FIGS. 10 through 13.

The internal voltage generators 219_i (where i is an integer from 1 to 4) supply DC voltages to circuits associated with the respective memory banks 201_i, and may include one or more circuits selected from a back-bias voltage generator, an internal power-supply voltage generator and other internal voltage generating circuits. In the DRAM of the present invention, the internal voltage generators 113_i exist for each memory bank and are enabled to be driven only when a self-refresh operation is performed on the corresponding memory bank. Here, for the sake of convenience in explanation, with respect to a self-refresh mode, the case where the internal voltage generators 219_i are enabled for each memory bank is representatively described. However, it is evident to one skilled in the art that the present invention can be applied to all operation modes in addition to the self-refresh mode.

Typical examples of the internal voltage generators 219_i (i=1 . . . 4) will later be described in detail with reference to FIG. 14.

Figure 3:
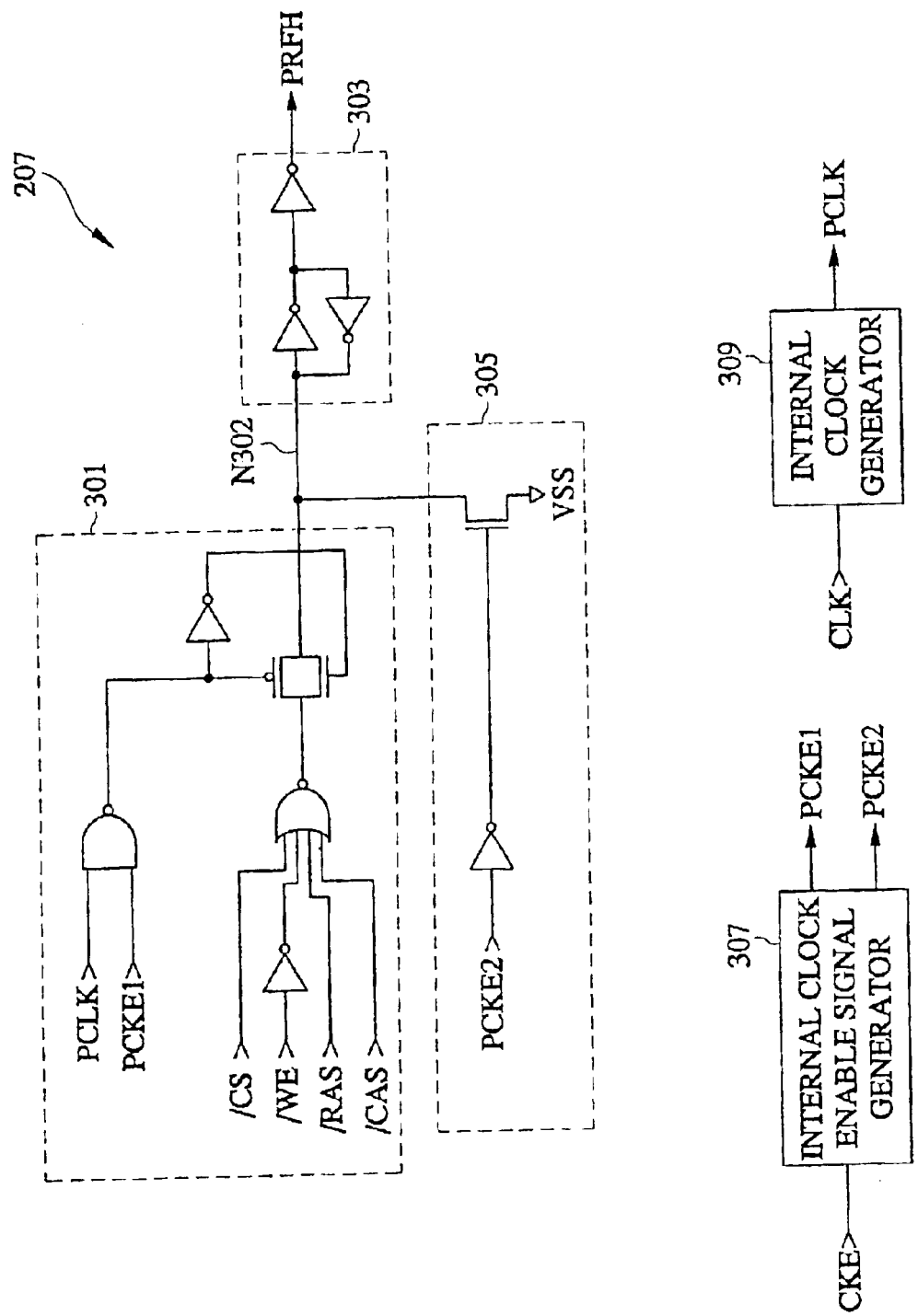
FIG. 3 is a detailed circuit diagram illustrating the refresh entry detector shown in FIG. 2.
Figure 4:
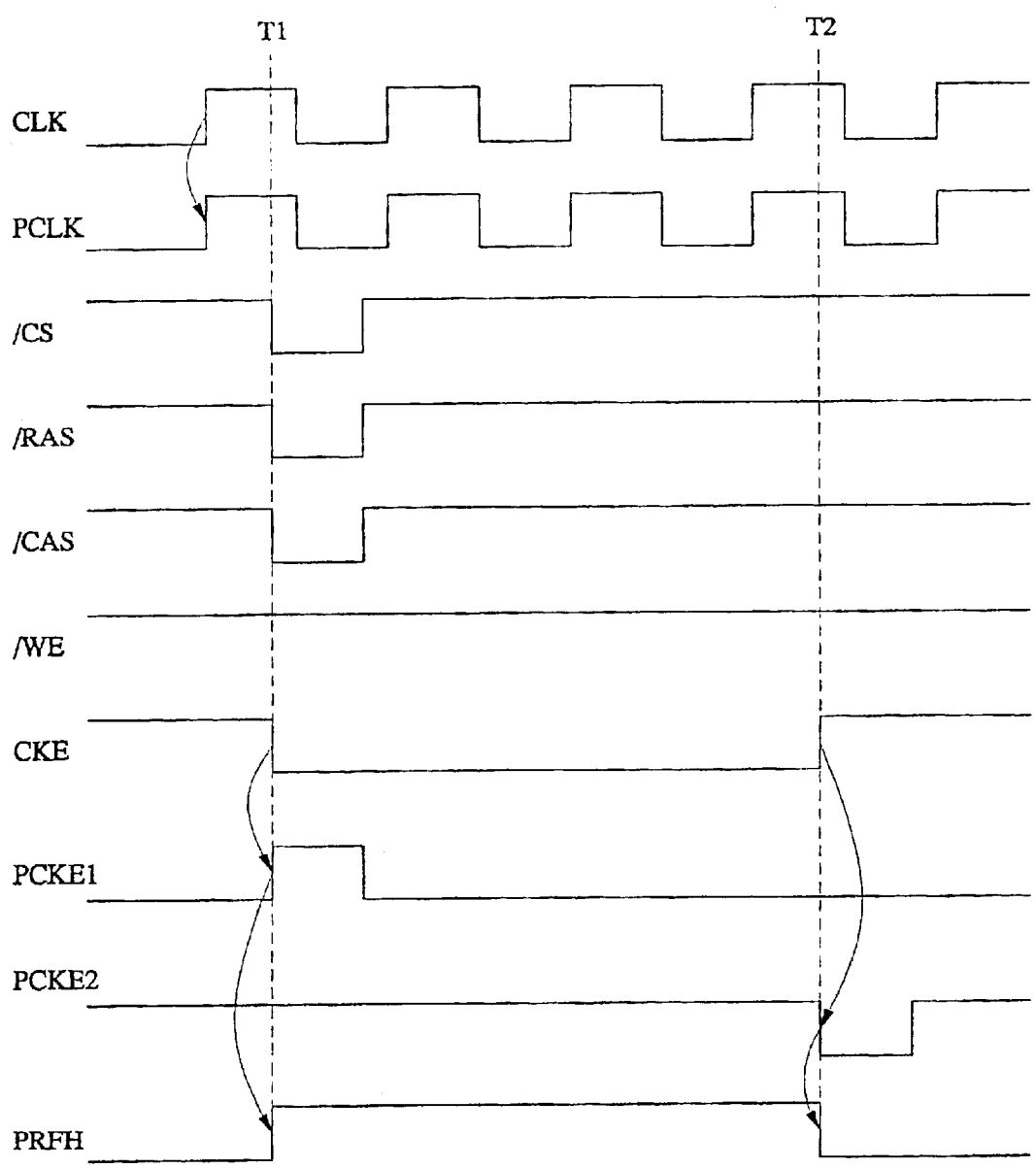
FIG. 4 is a timing diagram of various signals shown in FIG. 3.

FIG. 3 is a detailed circuit diagram of the refresh entry detector 207 shown in FIG. 2, and FIG. 4 is a timing diagram of various signals shown in FIG. 3. Referring to FIGS. 3 and 4, the structure and operation of the refresh entry detector 207 will now be described.

The refresh entry detector 207 includes an entry detecting part 301, a latching part 303 and a termination detecting part 305. The entry detecting part 301 detects the entry into a self-refresh mode by means of an internal clock signal PCLK, a first internal clock enable signal PCKE1, a chip selection signal/CS, a column address strobe signal/RAS and a write enable signal/WE. In other words, if a semiconductor memory device enters into a self-refresh mode, the output signal N302 of the entry detecting part 301 makes a transition to a logic "high" state.

The latching part 303 latches the output signal N302 of the entry detecting part 301 to generate the refresh instruction signal PRFH. If the self-refresh operation is terminated, the termination detecting part 305 pulls down the output signal N302 of the entry detecting part 301 to a logic "low" state in response to a second internal clock enable signal PCKE2.

The internal clock enable signal generator 307 generates first and second internal clock enable signals PCKE1 and PCKE2 in response to the clock enable signal CKE. The internal clock generator 309 generates the internal clock signal PCLK in response to a clock signal CLK.

Referring to FIG. 4, the clock signal CLK is a master clock of a semiconductor memory device, and the internal clock signal PCLK is a pulse which is activated in a synchronous relationship with the rising edge of the clock signal CLK. The clock enable signal CKE is a signal which instructs the effectiveness of a next clock. The clock enable signal CKE in the present invention transitions "low" when the self-refresh operation is performed. The first internal clock enable signal PCKE1 is generated as a logic "high" pulse in response to the falling edge of the clock enable signal CKE. The second internal clock enable signal PCKE2 is generated as a logic "low" pulse in response to a rising edge of the clock enable signal CKE.

Thus, if the chip selection signal/CS, the column address strobe signal/RAS and the row address strobe signal/RAS are all enabled to a logic "low" level and the clock enable signal CKE becomes a logic "low" level, the refresh instruction signal PRFH is latched to a logic "high" level, which means an entry into a self-refresh mode. Also, if the clock enable signal CKE becomes a logic "high" level, the refresh instruction signal PRFH is latched to a logic "low" level, which represents a termination of a self-refresh mode.

Figure 5:
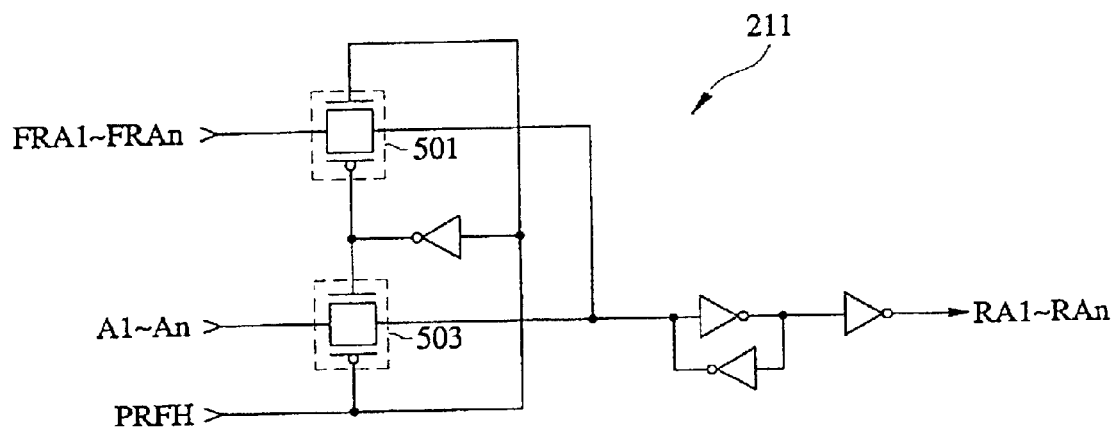
FIG. 5 is a circuit diagram illustrating the switch shown in FIG. 2.

FIG. 5 is a circuit diagram of the switch 211 shown in FIG. 2. Referring to FIG. 2, the switch 211 receives external addresses A1 to An or counting addresses FRA1 to FRAn to generate internal addresses RA1 to RAn. In other words, during a self-refresh mode in which the refresh instruction signal PRFH is at a logic "high" level, a transfer gate 501 is turned on. Thus, the internal addresses RA1 to RAn are latched to data identical with that of the counting addresses FRA1 to FRAn. Also, during a normal mode in which the refresh instruction signal PRFH is at a logic "low" level, a transfer gate 503 is turned on. Thus, the internal addresses RA1 to RAn are latched to data identical with that of the external addresses A1 to An. Note that each transfer "gate" represents a plurality of "n" transfer gates, one for each bit on each address bus FRAn, An.

Figure 6:
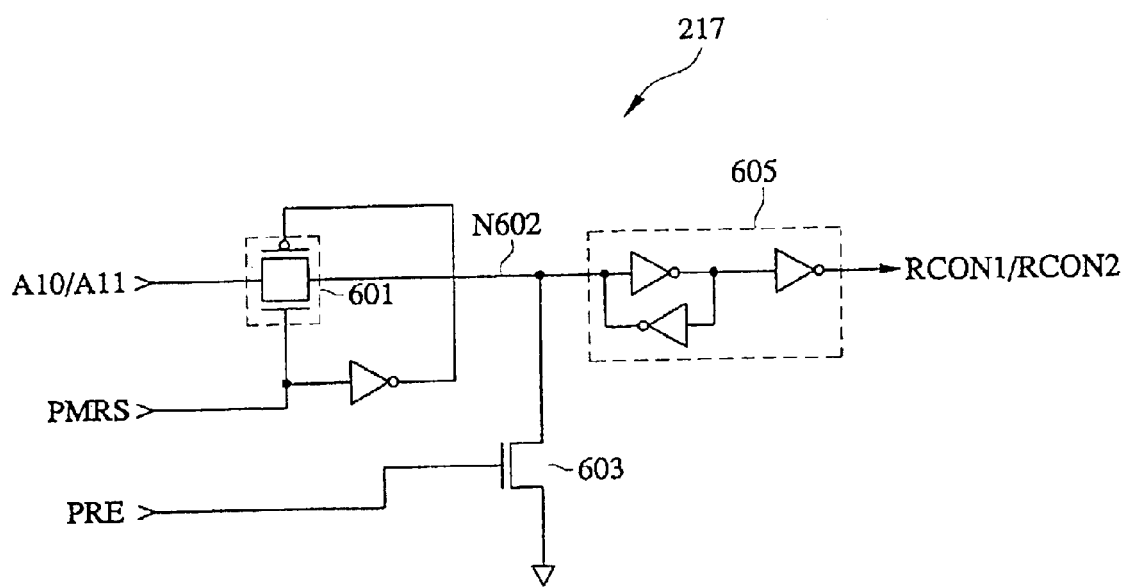
FIG. 6 is a circuit diagram illustrating the refresh controller shown in FIG. 2, in which a refresh control signal is generated by an external address.

FIG. 6 is a circuit diagram of the refresh controller 217 shown in FIG. 2, in which a refresh control signal is generated by external addresses. For the sake of convenience in explanation, for example, refresh control signals RCON1 and RCON2 are generated by external address bits A10 and A11. In alternative embodiments, the external addresses are not necessarily A10 or A11. Each refresh control signal RCON1/RCON2 is generated by one external address A10/A11.

Referring to FIG. 6, the refresh controller 217 includes a transfer gate 601, an NMOS transistor 603 and a latch 605. The transfer gate 601 receives specific external addresses A10 and A11 during a period in which a mode register setting signal PMRS is at a logic "high" level. Here, the mode register setting signal PMRS is activated to a logic "high" level in a period in which a combination of DRAM control signals, for example, /RAS, /CAS, /CS and /WE, are all activated.

The NMOS transistor 603 is gated by a precharge signal PRE which is activated to a logic "high" level for a predetermined time duration in an initial power-up period of a power supply voltage. The latch 605 latches a signal N602 generated by the external addresses A10 and A11 transferred by the transfer gate 601, or the precharge signal PRE.

Thus, the refresh control signals RCON1 and RCON2 are latched to a logic "low" level in a precharge period. After the precharge signal is latched to a logic "low" level, the external addresses A10 and A11 input in the period where the mode register setting signal PMRS is at a logic "high" level is transferred by the transfer gate 601.

At this stage, the refresh control signals RCON1 and RCON2 are generated by the external addresses A10 and A11. In other words, in the case where the external addresses A10 and A11 are at a logic "high" level, the refresh control signals RCON1 and RCON2 are latched to a logic "high" level. Also, in the case where the external addresses A10 and A11 are at a logic "low" level, the refresh control signals RCON1 and RCON2 are latched to a logic "low" level.

In the refresh controller 217 shown in FIG. 6, in the case where the external addresses A10 and A11 designate memory banks for storing data, the refresh operation in the DRAM of the present invention is performed only with respect to memory banks in which data is stored.

Figure 7:
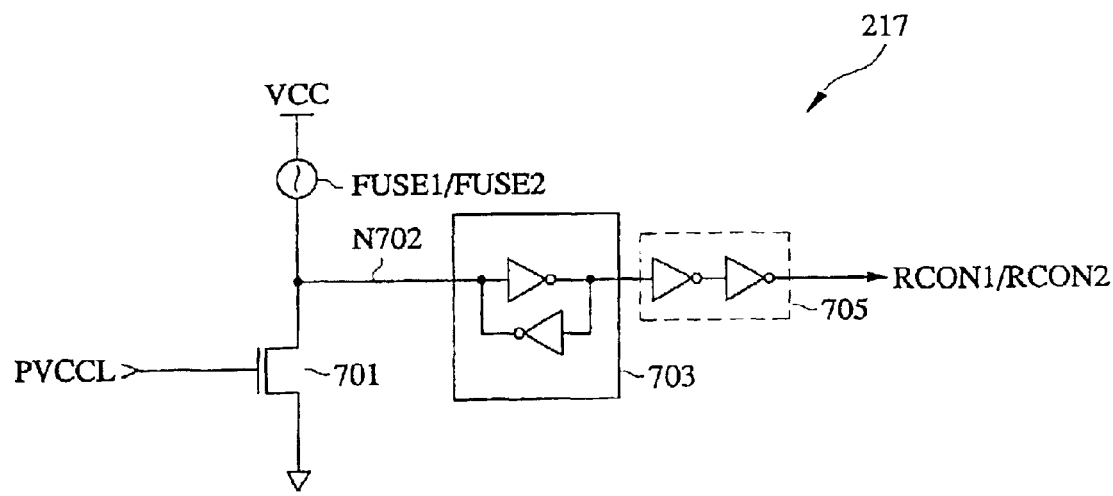
FIG. 7 is circuit diagram of another example of the refresh controller shown in FIG. 2, in which a refresh control signal is controlled by a control fuse.

FIG. 7 is another circuit diagram of the refresh controller 217 shown in FIG. 2, in which refresh control signals RCON1 and RCON2 are controlled by a control fuse. Here, for convenience' sake of explanation, the refresh control signals RCON1 and RCON2 are generated by control fuses FUSE1 and FUSE2.

The refresh controller 217 shown in FIG. 7 includes control fuses FUSE1 and FUSE2, an NMOS transistor 701, a latch 703 and a buffer 705. The NMOS transistor 701 has a relatively large resistance element. Thus, if the control fuses FUSE1 and FUSE2 are opened, the drain port N702 of the NMOS transistor 701 becomes "low". Here, the refresh control signals RCON1 and RCON2 are latched to a logic "high" level.

In such a refresh controller shown in FIG. 7, in the case where there is further provided an apparatus for performing cutting of the control fuses FUSE1 and FUSE2 by address information for designating the memory bank for storing data, the refresh operation in the DRAM of the present invention can be performed only with respect to the memory bank in which data is stored.

Figure 8:
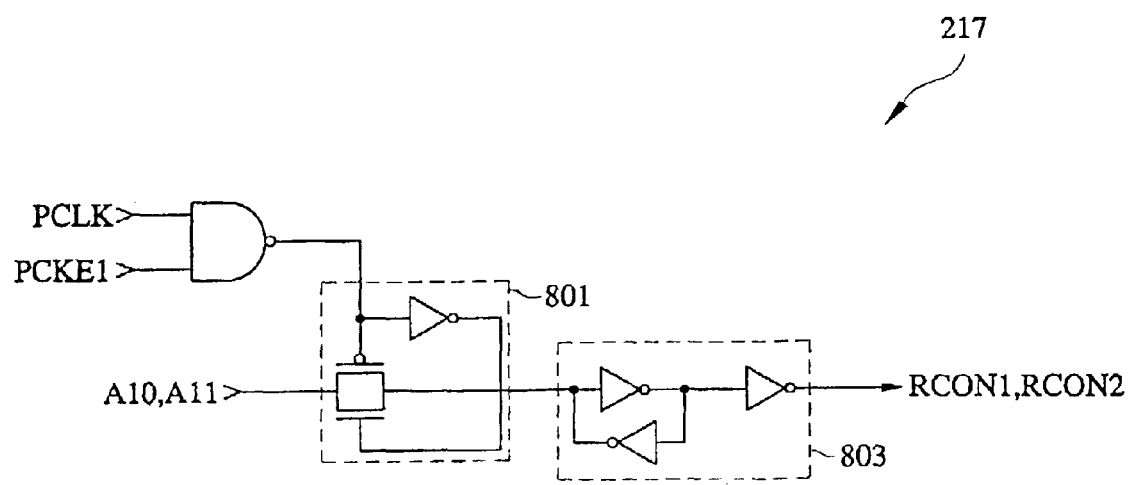
FIG. 8 is a another circuit diagram of the refresh controller shown in FIG. 2.

FIG. 8 is still another circuit diagram of the refresh controller 217 shown in FIG. 2, in which refresh control signals are generated by external addresses, like in FIG. 6. Referring to FIG. 8, the refresh controller 217 includes a transfer gate 801 and a latch 803. The transfer gate 801 receives external addresses A10 and A11 during a period in which a first internal clock enable signal PCKE1 and an internal clock signal PCLK are in a logic "high" level. The latch 803 latches the external addresses A10 and A11 transferred by the transfer gate 801 to generate the refresh control signals RCON1 and RCON2. In other words, in the case where the external addresses A10 and A11 are at a logic "high" level, the refresh control signals RCON1 and RCON2 are latched to a logic "high" level. Also, in the case where the external addresses A10 and A11 are at a logic "low" level, the refresh control signals RCON1 and RCON2 are latched to a logic "low" level.

Figure 9:
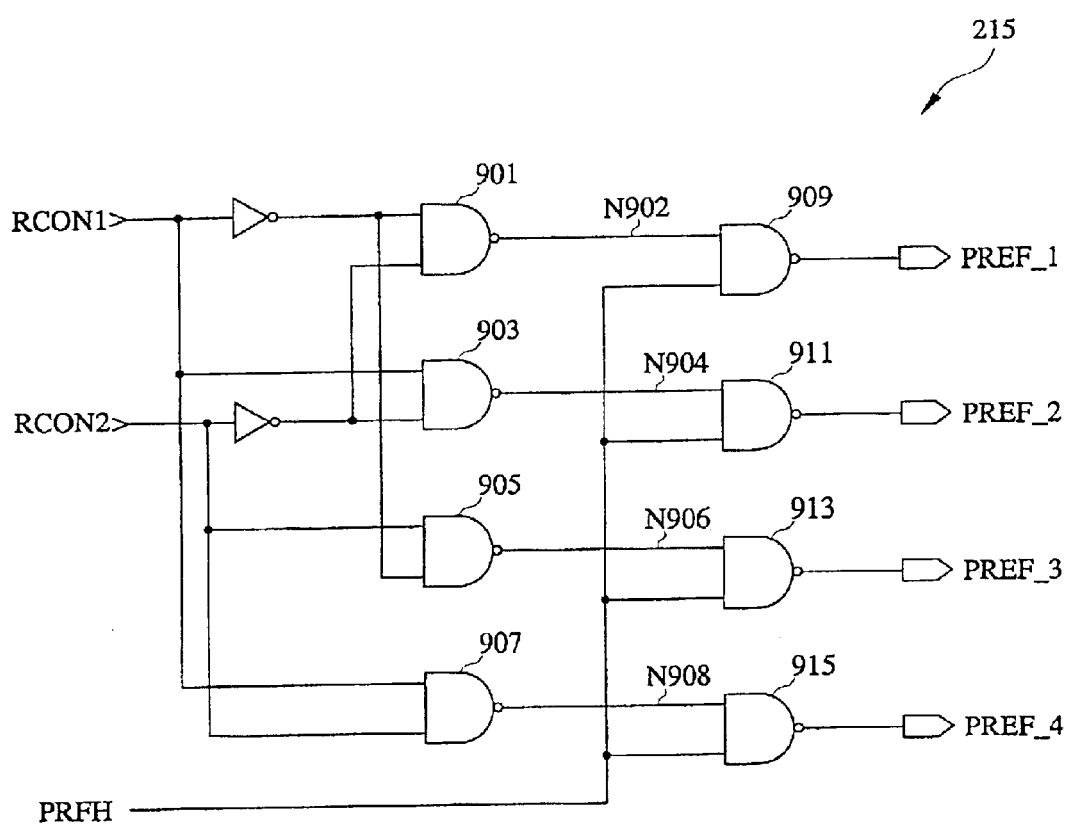
FIG. 9 is a detailed circuit diagram of the decoder shown in FIG. 2.

FIG. 9 is a detailed circuit diagram of the decoder 215 shown in FIG. 2. Referring to FIG. 9, the decoder 215 includes four NAND gates 909, 911, 913 and 915 enabled during operation in a refresh mode in which the refresh instruction signal PRFH is at a logic "high" level, and another group of four NAND gates 901, 903, 905 and 907 for decoding the refresh control signals RCON1 and RCON2.

In the refresh mode, if the refresh control signals RCON1 and RCON2 are both at a logic "low" level, the output signal N902 of the NAND gate 901 becomes "low". In response, the first refresh bank designating signal PREF_1 which is the output signal of the NAND gate 909, becomes "high".

In the refresh mode, if the refresh control signal RCON1 is at a logic "high" level, and RCON2 is at a logic "low" level, the output signal N904 of the NAND gate 903 becomes "low". In response, the second refresh bank designating signal PREF_2, which is the output signal of the NAND gate 911, becomes "high".

In the refresh mode, if the refresh control signals RCON1 is at a logic "low" level, and RCON2 is at a logic "high" level, the output signal N906 of the NAND gate 905 becomes "low". In response, the third refresh bank designating signal PREF_2, which is the output signal of the NAND gate 913, becomes "high".

In the refresh mode, if the refresh control signals RCON1 and RCON2 are both at a logic "high" level, the output signal N908 of the NAND gate 907 becomes "low". The fourth refresh bank designating signal PREF_4, which is the output signal of the NAND gate 915, becomes "high".

Figure 10:
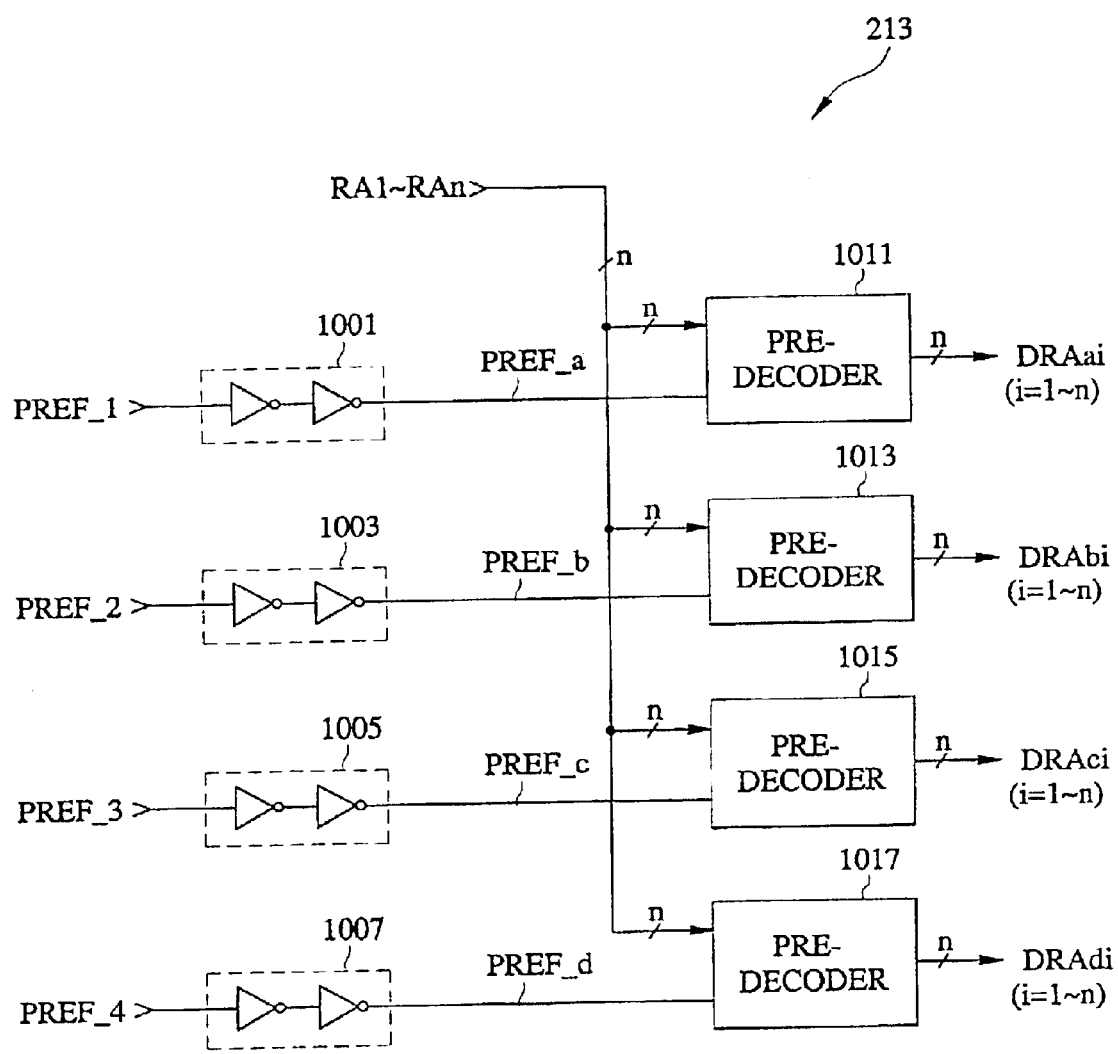
FIG. 10 is a circuit diagram of the bank selection decoder shown in FIG. 2, in which a bank is selected by a refresh bank designating signal.

FIG. 10 is a circuit diagram of the bank selection decoder 213 shown in FIG. 2, in which a bank is selected by a refresh bank designating signal. Referring to FIG. 10, the bank selection decoder 213 includes four buffers 1001, 1003, 1005 and 1007 and four pre-decoders 1011, 1013, 1015 and 1017.

The buffers 1001, 1003, 1005 and 1007 buffer the first through fourth refresh bank designating signals PREF_1 through PREF_4 to generate first through fourth decoding signals PREF_j (j=a, b, c and d). Thus, the first through fourth decoding signals PREF_a through PREF_d represent the same information as that of the first through fourth refresh bank designating signals PREF_1 through PREF_4. Referring back to FIG. 2, the first through fourth decoding signals PREF_a through PREF_d are supplied to the internal voltage generators 219_1 through 219_4, respectively, to control the same.

Referring back to FIG. 10, the pre-decoders 1011, 1013, 1015 and 1017 are enabled in response to the first through fourth decoding signals PREF_a through PREF_d. Also, the enabled pre-decoders 1011, 1013, 1015 and 1017 receive internal addresses RA1 to RAn to generate refresh addresses DRAji (where j=a, b, c and d and i=1 to n.). The pre-decoders 1011, 1013, 1015 and 1017 will be described later in more detail with reference to FIGS. 11 and 12.

The operation of the bank selection decoder 213 shown in FIG. 10 will now be described for the case in which the first refresh bank designating signal PREF_1 is activated. If the first refresh bank designating signal PREF_1 is activated, the first decoding signal PREF_a is activated. As the first decoding signal PREF_a is activated, the first pre-decoder 1011 is enabled. Thus, the first refresh addresses DRAai (i=1 to n) have the same information as the internal addresses RA1 to RAn. The first refresh addresses DRAai (i=1 to n) are transferred to the first row decoder 203_1 for decoding rows of the first memory bank 201_1 (FIG. 2) to then refresh memory cells of the first memory bank 201_1.

When the first refresh bank designating signal PREF_1 is activated in the bank selection decoder 213, the second through fourth refresh bank designating signals PREF_2 through PREF_4 are deactivated and the second through fourth pre-decoders 1013, 1015 and 1017 are disabled. Thus, the second through fourth refresh addresses DRAji, (j=b, c and d, and i=1 to n.) are maintained at a logic "low" level, which is a precharged state. Thus, the refresh operation is not performed on the memory cells of the second through fourth memory banks 201_2 through 201_4. In the case of implementing a DRAM capable of selectively performing a refresh operation for each bank using the bank selection decoder 213 shown in FIG. 10, only one memory bank is selected and then refresh addresses are supplied thereto.

Referring back to FIGS. 9 and 10, banks are selected based on the refresh control signals RCON1 and RCON2 as follows.

TABLE 1

| RCON1 | RCON2 | Bank selection |
|---|---|---|
| 0 | 0 | First memory bank |
| 0 | 1 | Second memory bank |
| 1 | 0 | Third memory bank |
| 1 | 1 | Fourth memory bank |

Figure 11:
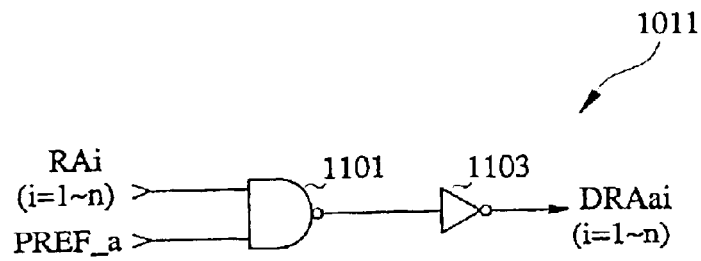
FIG. 11 is a detailed circuit diagram of a pre-decoder shown in FIG. 10.

FIG. 11 is a detailed circuit diagram of a pre-decoder shown in FIG. 10. Since the first through fourth pre-decoders are implemented by the same configuration, the first pre-decoder 1011 will be representatively described.

Referring to FIG. 11, the first pre-decoder 1011 is implemented by a NAND gate 1101 and an inverter 1103. The NAND gate 1101 is enabled by activation of the first decoding signal PREF_a. Thus, the first refresh addresses DRAai (i=1 to n) carry the same information as the internal address RAi (i=1 to n).

Figure 12:
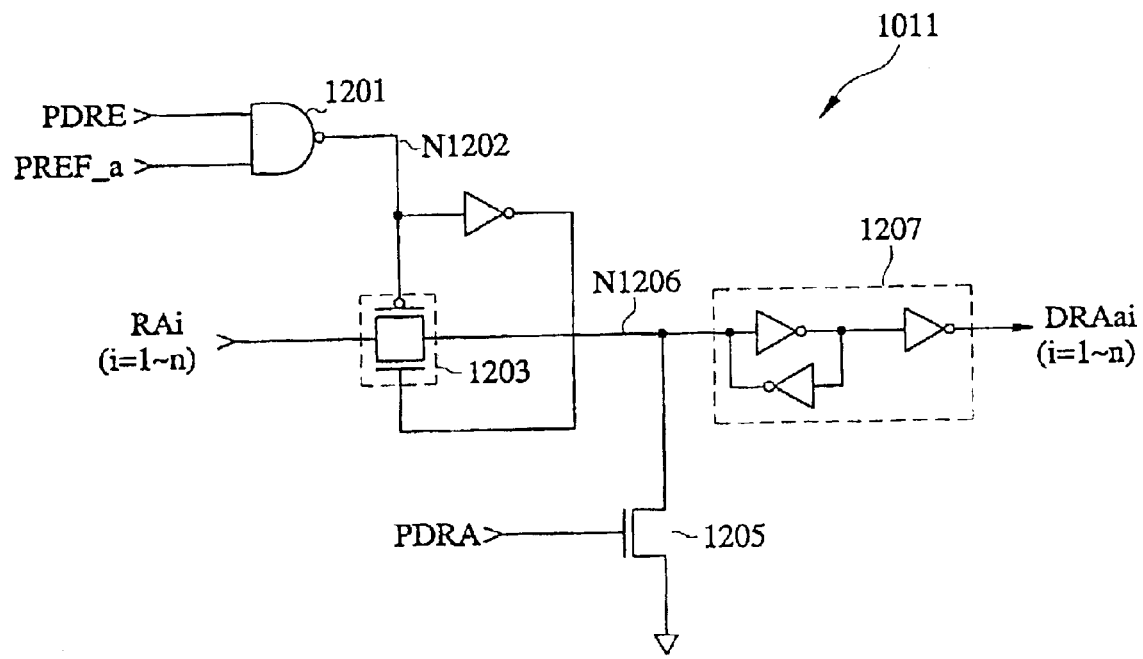
FIG. 12 is a another detailed circuit diagram of one of the pre-decoders shown in FIG. 10.

FIG. 12 is another detailed circuit diagram of a pre-decoder shown in FIG. 10. Referring to FIG. 12, the first pre-decoder 1011 shown in FIG. 12 includes a NAND gate 1201, a transfer gate 1203, an NMOS transistor 1205 and a latch 1207. The NAND gate 1201 receives the first decoding signal PREF_a and the first precharge control signal PDRE. Also, the output signal N1202 of the NAND gate 1201 controls the transfer gate 1203. The first precharge signal PDRE is at a logic "low" state in a precharge period and goes "high" after the precharge period.

The transfer gate 1203 receives internal addresses RAi (i=1 to n) in response to the output signal N1202 of the NAND gate 1201. The NMOS transistor 1205 precharges the first refresh addresses DRAai (i=1 to n) which are output signals of the first predecoder 1011 to a logic "low" level in response to the second precharge control signal PDRA which is activated in the precharge period. The latch 1207 latches the signal transferred by the transfer gate 1203 or the precharged signal by the NMOS transistor 1205.

Thus, if the precharge period is terminated and the first decoding signal PREF_a is activated, the refresh addresses DRAai (i=1 to n) are latched to have the same information as the internal addresses RAi (i=1 to n).

Figure 13:
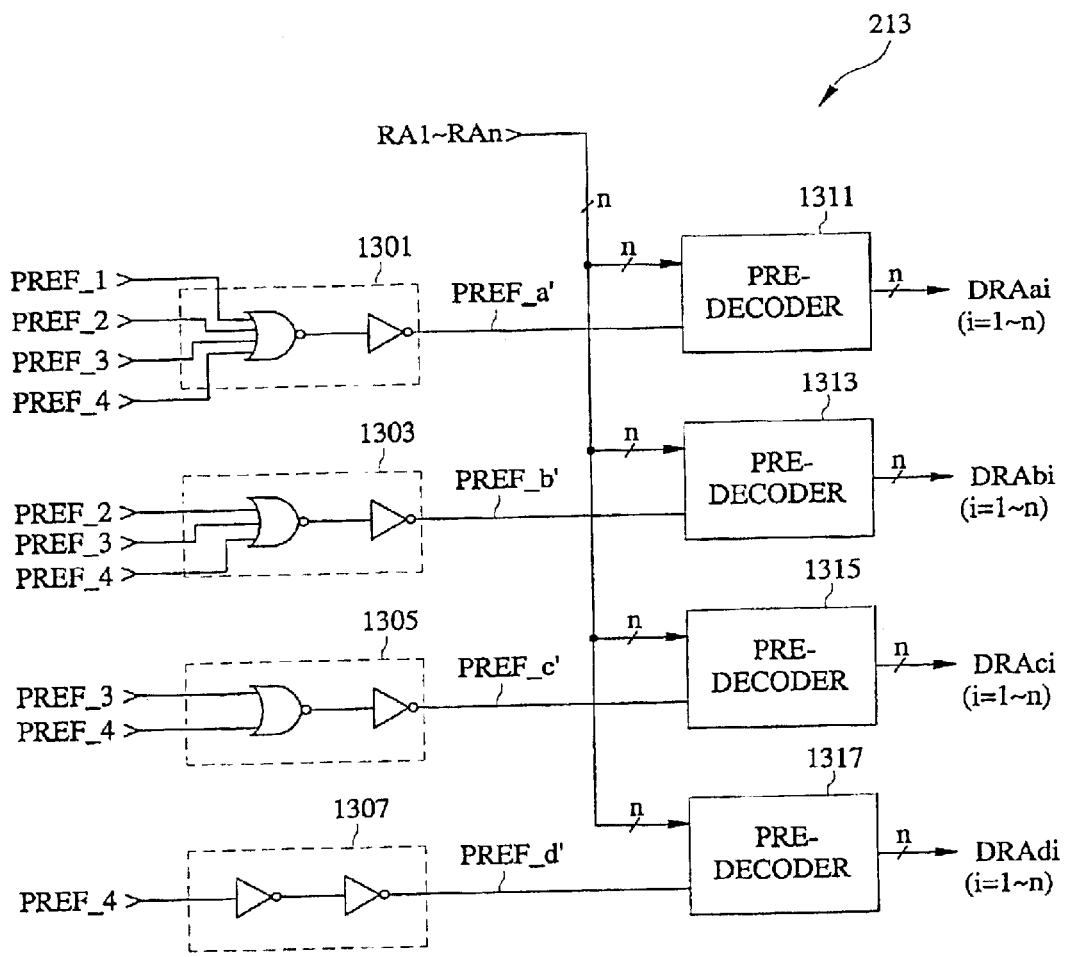
FIG. 13 is another circuit diagram of a bank selection decoder shown in FIG. 2, in which the number of refreshed banks can be variably controlled.

FIG. 13 is another circuit diagram of the bank selection decoder shown in FIG. 2, in which the number of the banks to be refreshed can be variably controlled. Referring to FIG. 13, the bank selection decoder 213 includes four logic elements 1301, 1303, 1305 and 1307 and four pre-decoders 1311, 1313, 1315 and 1317.

The first logic element 1301 receives the first through fourth refresh bank designating signals PREF_i (i=1 to 4) as input signals and performs an OR operation to generate a first decoding signal PREF_a'. The second logic element 1303 receives the second through fourth refresh bank designating signals PREF_i (i=2 to 4) as input signals and performs an OR operation to generate a second decoding signal PREF_b'. The third logic element 1305 receives the third and fourth refresh bank designating signals PREF_i (i=3 and 4) as input signals and performs an OR operation to generate a third decoding signal PREF_c'. The fourth logic element 1307 receives the fourth refresh bank designating signal PREF_4 as an input signal to generate a fourth decoding signal PREF_d'.

The decoding signals are controlled according to the activation of the first through fourth refresh bank designating signals PREF_i (i=1 to 4) as follows.

If the first refresh bank designating signal PREF_1 is activated, the first decoding signal PREF_a' is activated and the second through fourth decoding signals PREF_b' are deactivated. Thus, while the first refresh addresses DRAai (i=1 to n) have the same information as the internal addresses RA1 to RAn, the second through fourth refresh addresses DRAbi, DRAci and DRAdi (i=1 to n) are maintained at a logic "low" level, which is a precharged state. Thus, the first memory bank 201_1 (FIG. 2) performs a refresh operation and the second through fourth memory banks 201_i (i=2 to 4) do not perform a refresh operation.

If the second refresh bank designating signal PREF_2 is activated, the first decoding signal PREF_a' and the second decoding signals PREF_b' are activated and the third and fourth decoding signals PREF_c' and PREF_d' are deactivated. Thus, while the first and second refresh addresses DRAai and DRAbi (i=1 to n) have the same information as the internal addresses RA1 to RAn, the third and fourth refresh addresses DRAci and DRAdi (i=1 to n) are maintained at a logic "low" level, which is a precharged state. Thus, the first and second memory banks 201_1 and 201_2 perform a refresh operation and the third and fourth memory banks 201_3 and 201_4 do not perform a refresh operation.

If the third refresh bank designating signal PREF_3 is activated, the first through third decoding signals PREF_a', PREF_b' and PREF_c' are activated and the fourth decoding signal PREF_d' is deactivated. Thus, while the first through third refresh addresses DRAai, DRAbi and DRAci (i=1 to n) have the same information as the internal addresses RA1 to RAn, the fourth refresh addresses DRAdi (i=1 to n) are maintained at a logic "low" level, which is a precharged state. Thus, the first through third memory banks 201_1, 201_2 and 201_3 perform a refresh operation and the fourth memory bank 201_4 does not perform a refresh operation.

If the fourth refresh bank designating signal PREF_4 is activated, the first through fourth decoding signals PREF_a', PREF_b', PREF_c' and PREF_d' are all activated. Thus, the first through fourth refresh addresses DRAai, DRAbi, DRAci and DRAdi (i=1 to n) have the same information as the internal addresses RA1 to RAn. Thus, the first and second memory banks 201_1, 201_2, 201_3 and 201_4 perform a refresh operation.

The first through fourth pre-decoders 1311, 1313, 1315 and 1317 shown in FIG. 13 can be implemented by the same configuration as the predecoders 1011, 1013, 1015 and 1017 shown in FIG. 10, and a detailed explanation thereof will be omitted.

The bank selection decoder 213 shown in FIG. 13 can have a variable number of pre-decoders. Also, in the DRAM capable of selectively performing a refresh operation according to the present invention, it is possible to selectively refresh only those memory banks having memory cells in which data is stored. Also, the number of refreshed memory banks can be varied by using the bank selection decoder shown in FIG. 13.

Figure 14:
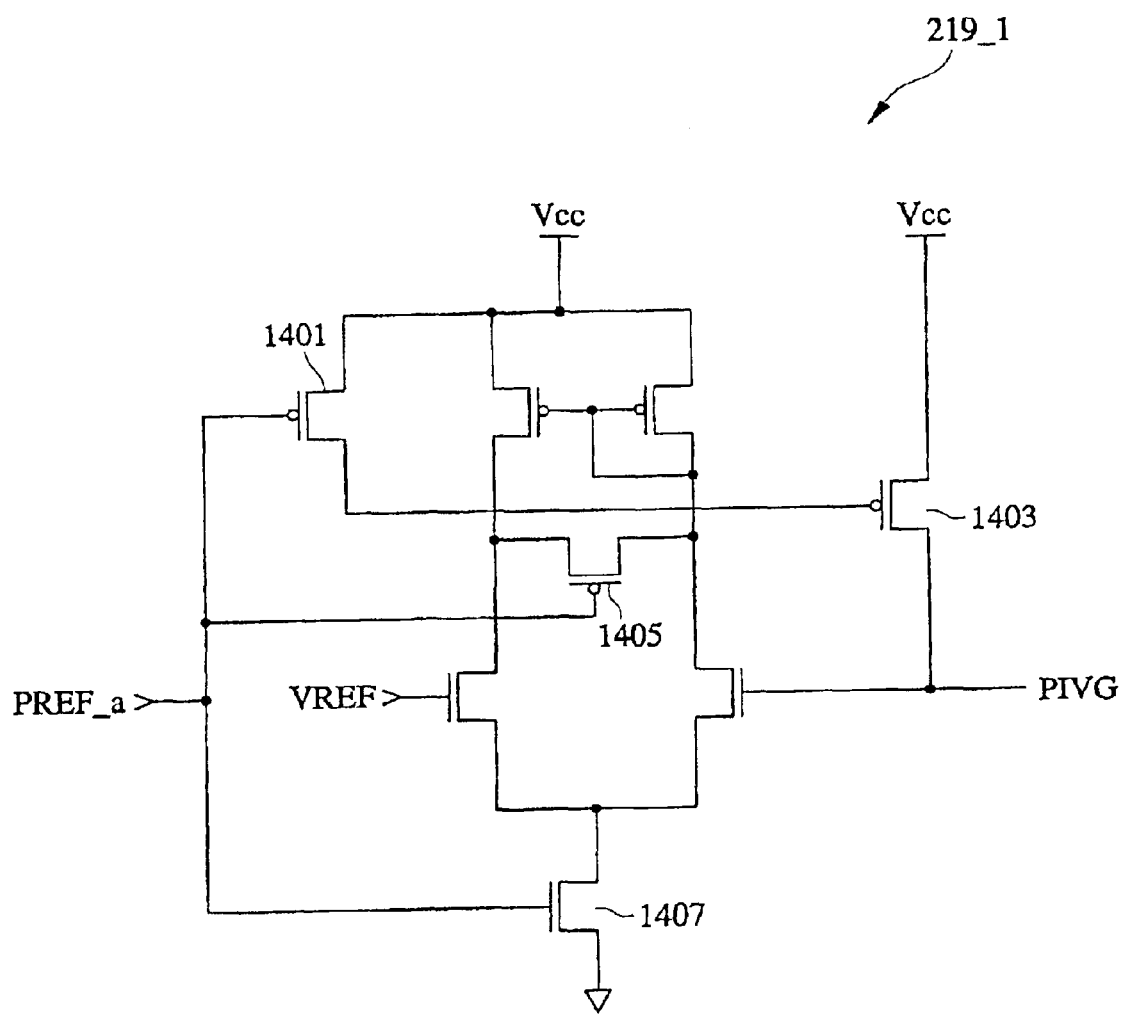
FIG. 14 is a circuit diagram of the internal voltage generator shown in FIG. 2.

FIG. 14 is a circuit diagram of an internal voltage generator shown in FIG. 1, in which an internal power-supply voltage generator is illustrated as an example of the internal voltage generator. However, it is evident to one skilled in the art that the invention can also be applied to a back-bias voltage generator. Also, although a first internal voltage generator 219_1 is representatively illustrated, the present invention can be applied to second through fourth internal voltage generators 219_i (i=2 to 4).

First, in the case where a refresh operation is performed with respect to a first memory bank 201_1 (see FIG. 2), a first decoding signal PREFa goes "high". Then, PMOS transistors 1401 and 1405 are turned off and an NMOS transistor 1407 is turned on. Thus, the internal power-supply voltage generator shown in FIG. 14 is enabled to generate an internal power supply voltage PIVG, as in the conventional art. Since the operational principle of generating the internal power supply voltage PIVG is well known to one skilled in the art, a detailed explanation thereof will be omitted.

In the case where a refresh operation is not performed with respect to the first memory bank 201_1, the first decoding signal PREF_a goes "low". Then, the PMOS transistors 1401 and 1405 are turned on and the NMOS transistor 1407 and a PMOS transistor 1403 are turned off. Thus, the internal power-supply voltage generator shown in FIG. 14 is disabled to stop operating. As described above, the internal power-supply voltage generator shown in FIG. 14 operates such that only the internal voltage generator corresponding to a memory bank on which the refresh operation is performed operates. Thus, the internal voltage generator corresponding to a memory bank on which the refresh operation is not performed stops operating, thereby greatly reducing power consumption.

In addition to the preferred embodiments described above for performing a full array self-refresh on one or more selected memory banks of a memory cell, other embodiments of the present invention provide mechanisms for performing a PASR (partial array self-refresh) operation for a portion (one or more blocks) of one or more selected memory banks. More specifically, the present invention provides mechanisms for performing a PASR operation for, e.g., ½, ¼, ⅛, or 1/16 of a selected memory bank. In general, in one embodiment of the present invention, a PASR operation is performed by (1) controlling the generation of row addresses by a row address counter during a self-refresh operation and (2) controlling a self-refresh cycle generating circuit to adjust the self-refresh cycle output therefrom. As explained below, the self-refresh cycle is adjusted in a manner that provides a reduction in the current dissipation during the PASR operation. In another embodiment, a PASR operation is performed by controlling one or more row addresses corresponding to a partial cell array during a self-refresh, whereby a reduction in a self-refresh current dissipation is achieved by blocking the activation of a non-used block of a memory bank.

Figure 15A:
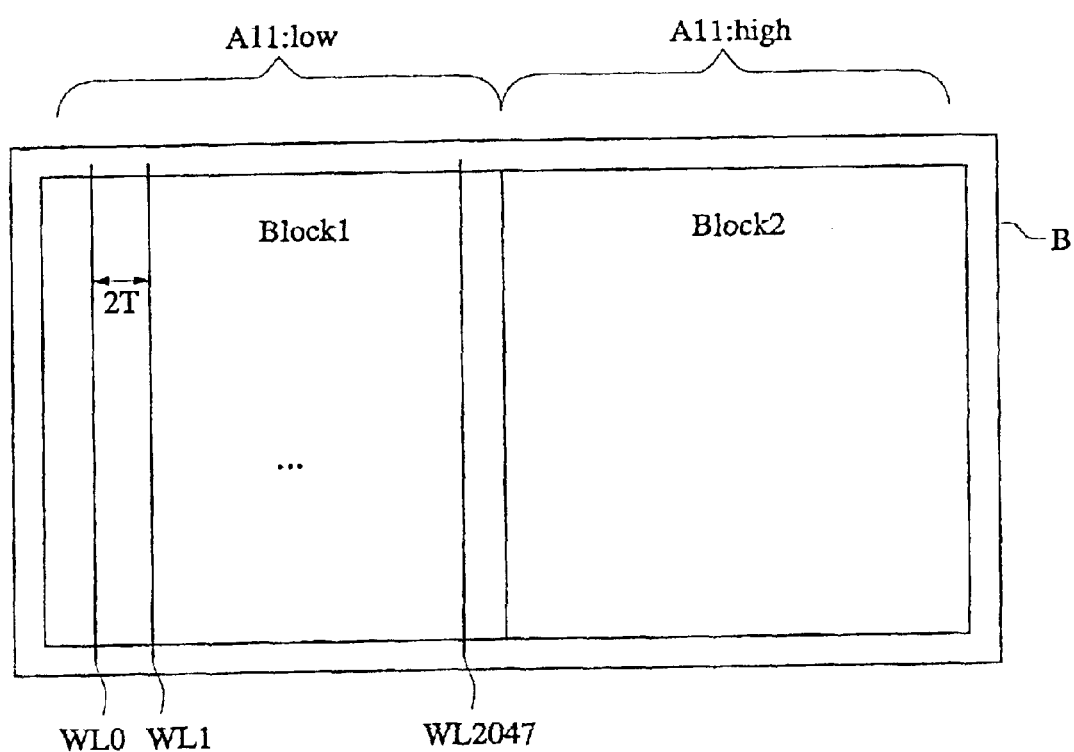
FIGS. 15(*a*) and 15(*b*) are diagrams respectively illustrating exemplary divisions of a memory bank for a ½ PASR and ¼ PASR operation according to the present invention.
Figure 15B:
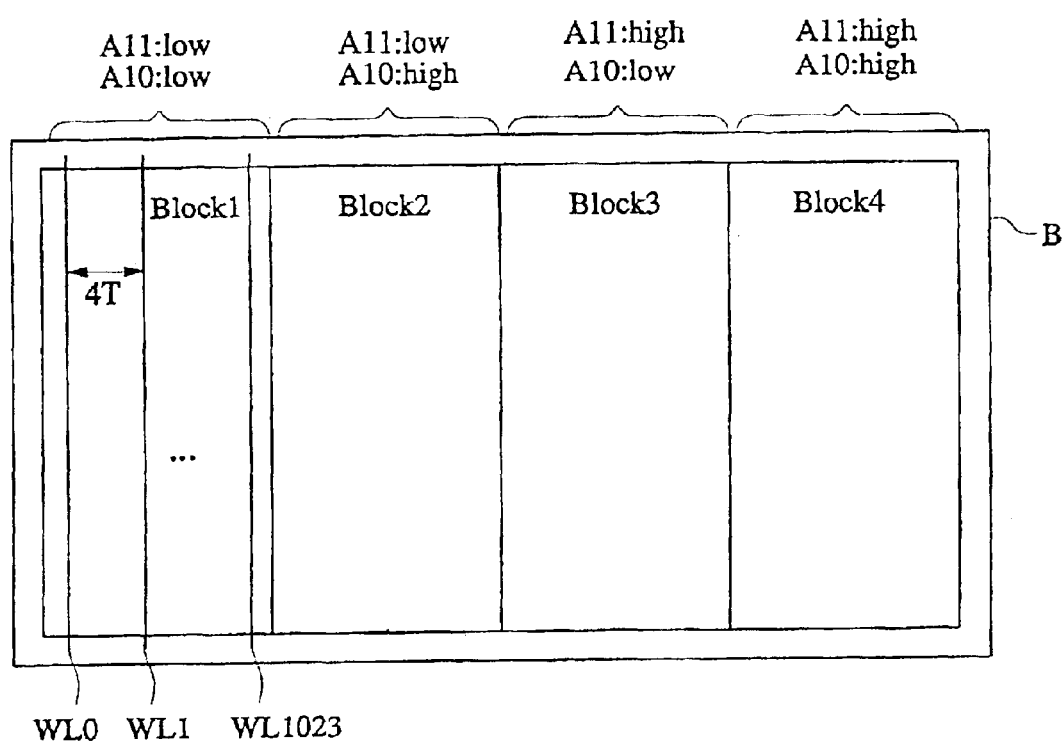

FIGS. 15a and 15b illustrate exemplary array divisions of one memory bank "B" of a plurality of memory banks in a semiconductor memory device. As explained above, a memory cell array of a semiconductor device can be divided into several memory banks using bank address coding (e.g., addresses A12 and A13 can be used to generate 4 memory banks). Furthermore, in accordance with the present invention, as illustrated in FIG. 15a, a memory bank B is logically divided into two blocks (Block 1, Block 2), preferably of equal size, using address coding of one address (e.g., A11). During a partial array self-refresh operation, Block 1 is accessed in response to address A11 of logic level "low" or Block 2 is accessed in response to address A11 of logic level "high". In other words, during a partial array self-refresh operation, self-refresh is performed on only one-half (½) of the memory bank (e.g., self-refresh is performed on Block 1 and not on Block 2).

Further, in FIG. 15b, a memory bank B is logically divided into four blocks (Block 1, Block 2, Block 3 and Block 4), preferably of equal size, using address coding of two addresses (e.g., A10, A11). During a partial self-refresh operation, one of Blocks 1–4 can be accessed by the corresponding address. For example, Block 1 is accessed in response to address A11 and A10 of logic level "low" and Block 2 is accessed in response to A11 of logic level low and A10 of logic level "high". In other words, during a partial array self-refresh operation, self-refresh is performed on only one-quarter (¼) of the memory bank (e.g., self-refresh is performed on Block 1 and not on Blocks 2–4). Likewise, a memory bank can be logically divided into 8 and 16 blocks respectively using 3 and 4 addresses (and so on), wherein a ⅛ or a 1/16 block of the memory bank is self-refreshed. A more detailed description of preferred embodiments for performing a PASR operation will now be described.

FIG. 16 is a schematic of a circuit for performing PASR operation according to an embodiment of the present invention. FIG. 16 illustrates an embodiment of the internal address generator and counter 209 shown in FIG. 2. The diagram of FIG. 16 further depicts a control method according to one aspect of the present invention for masking address bits generated by a self-refresh address counter and controlling a self-refresh cycle. The circuit of FIG. 16 comprises a command buffer 1601, an oscillator 1602, a self-refresh cycle (PSELF) generator 1603, an auto pulse generator 1604, a counter 1605, row address buffer 1606 and row address pre-decoder 1607.

The counter 1605 comprises a plurality of cycle counters (e.g., counter0-counter11). The number of cycle counters employed in the semiconductor memory device is preferably equal to the number of address bits needed to generate the internal addresses for activating the word lines. For instance, in the exemplary embodiments of FIGS. 15a and 15b wherein the number of word lines per memory bank is 4096, 12 address bits (CNT0-CNT11) are needed. Thus, in the exemplary embodiment of FIG. 16, the counter 1605 comprises 12 cycle counters.

The command buffer 1601 receives as input an external self-refresh command signal (which is applied to the semiconductor memory chip) and outputs an internal refresh control signal IN2 in response thereto. Depending on the logic level of the control signal IN2, either a full array self-refresh operation will be performed for one or more selected memory banks in their entirety or a PASR operation will be performed for a portion of one or more selected memory banks.

More specifically, in one embodiment, if the control signal IN2 is set to logic "high" in response to the self-refresh command signal, a full array self-refresh operation will be performed for one or more selected memory banks. FIG. 17 is a timing diagram illustrating control signals for performing a full array self-refresh operation for one or more selected memory banks. In response to a logic "high" control signal IN2, the oscillator 1602 generates a signal POSC. The POSC signal is input to the PSELF generator 1603, which generates a PSELF pulse signal having a predetermined period "T" that is several times greater than the period of the POSC pulse signal. The auto pulse generator 1604 generates a CNTP pulse signal in response to the rising edge of each pulse comprising the PSELF control signal. The CNTP signal is input to the counter 1605 to thereby generate address signals CNT0 through CNT11, which address signals are triggered by the rising edge of the PSELF signal. The counter sequentially generates the internal row addresses which are input to the row address buffer 1606. Thereafter, the buffered row addresses are decoded by the row address pre-decoder 1607 and a full self-refresh operation is performed for a selected memory bank (as described above) by sequentially activating the word lines. Each word line is activated as shown in FIG. 17.

Accordingly, in the case of a full array self-refresh operation for a given selected memory bank, the partial self-refresh signal IN2 is fixed to a logic "high" level, so that a signal CNT11 is generated based on the toggling of the auto pulse signal CNTP generated during a refresh operation (as shown in FIG. 17).

Figure 18A:
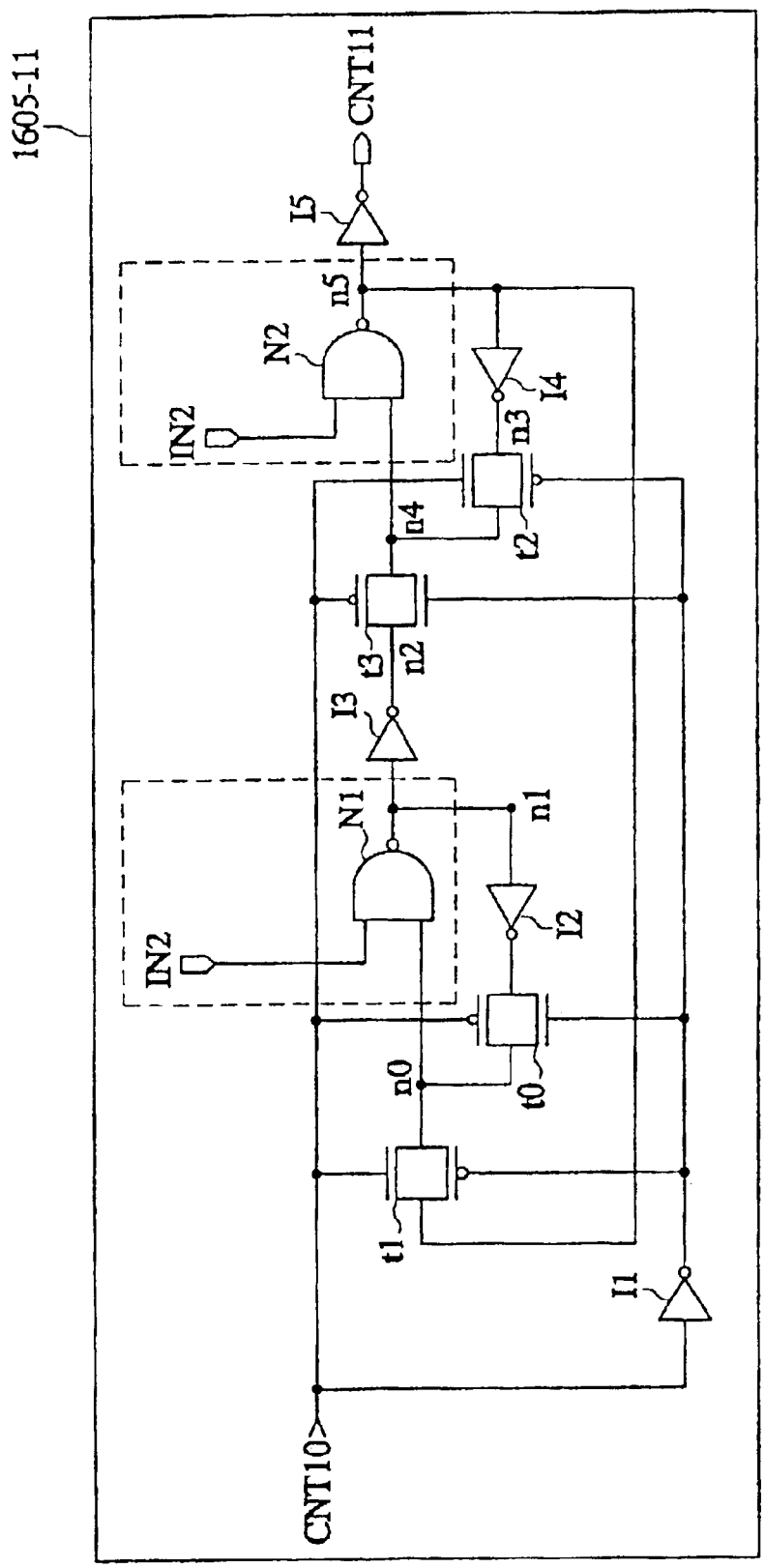
FIG. 18(a) is a circuit diagram of a cycle counter according to an embodiment of the present invention.

On the other hand, in case of a PASR operation in accordance with one aspect of the present invention, the control signal IN2 is set to a logic "low" level. In response to a logic "low" IN2 signal, the counter 11 does not operate in response to the CNTP signal and the address bit of counter 11 (i.e., CNT11) is masked and fixed to a logic "low" level. FIG. 18 is a schematic of a counter according to an embodiment of the present invention. More specifically, the diagram of FIG. 18 illustrates a cycle counter 1605-11 of the counter 1605 depicted in FIG. 16. The counter 1605_11 comprise a plurality of NAND buffers N1, N2 (which receive as input the IN2 refresh signal), a plurality of transfer gates t0–t3, and a plurality of inverter buffers $I_1$–$I_4$, all of which are operatively connected as shown.

Figure 18B:
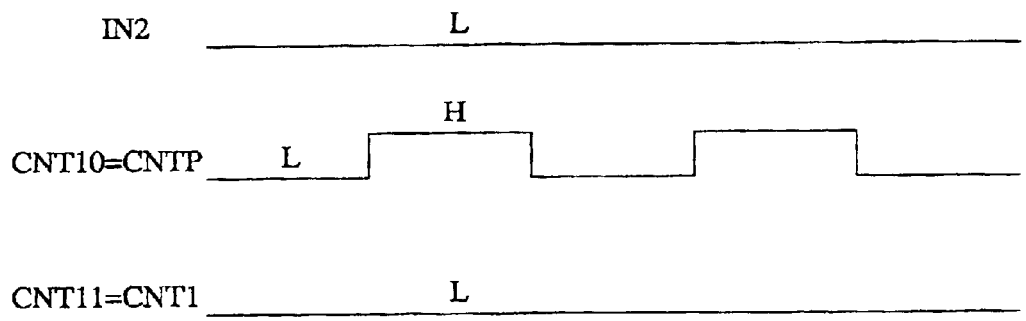
FIG. 18(b) is a timing diagram illustrating operation of the cycle counter of FIG. 18(a) during a PASR operation.

As noted above, and as illustrated by the timing diagram of FIG. 18b, an IN2 signal of logic level "low" is applied to the counter 1605-11 to disable operation of the counter and maintain the output bit (CNT11) of the counter to logic level "low", regardless of the input level of CNT10. Briefly, the counter 1605-11 operates as follows. Assume the initial state of the internal nodes are as follows—n0 (high), n (low), n2(high), n3(low), n4(low), n5(high), CNT11(low), IN2 (high). When CNTP10 goes low, t3 turns on, n4 goes high, n3 goes high, n5 goes low and the final output CNT11 goes high. When CNTP10 goes high, t1 turns on, n0 goes low, n1 goes high, and n2 goes low. The level of CNT11 continuously varies according to the low level of CNTP10.

Figure 19:
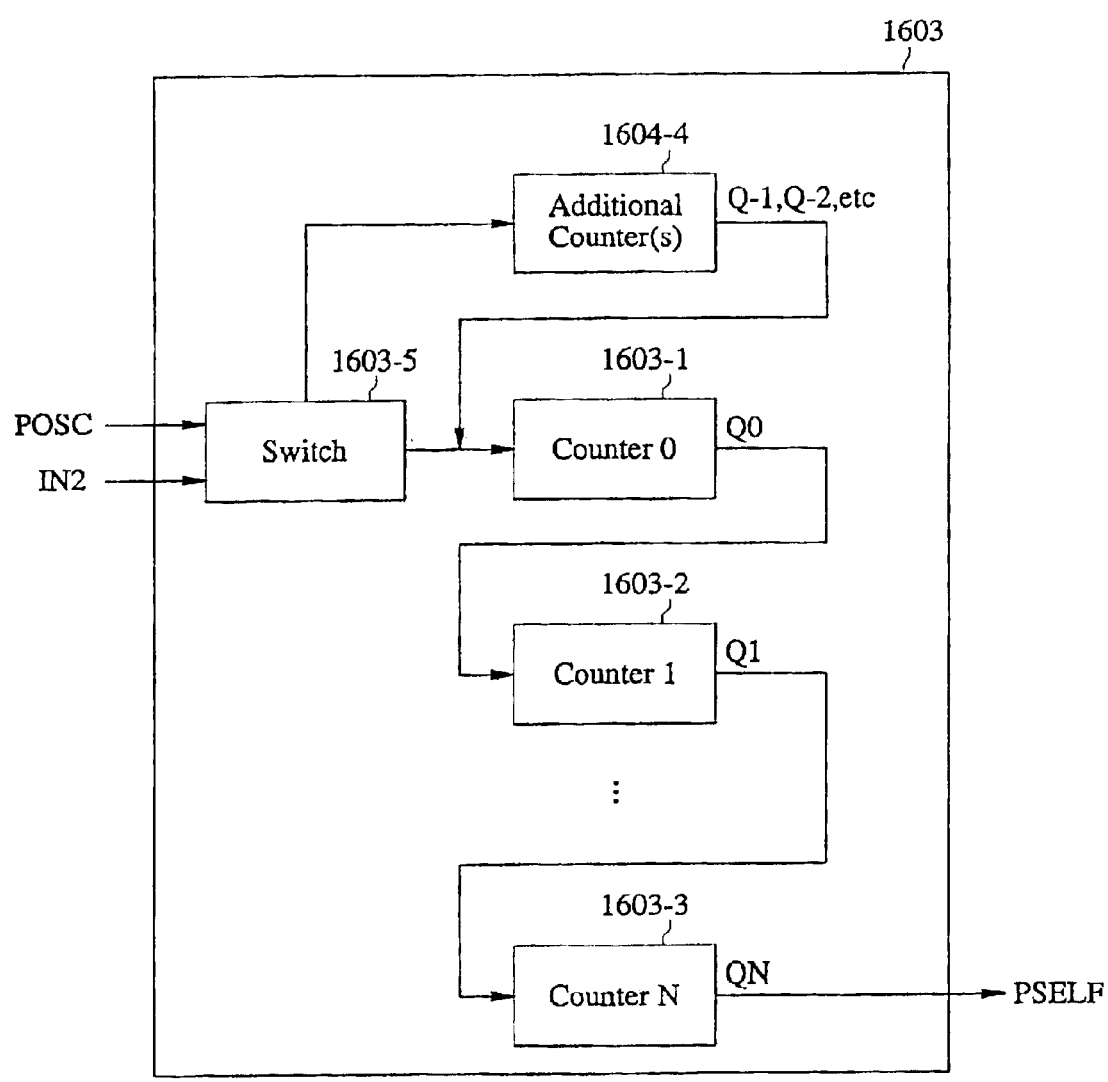
FIG. 19 is a schematic diagram of a self-refresh cycle generator according to an embodiment of the present invention.

Furthermore, as illustrated in FIG. 15(a), to prevent one bank from being refreshed twice during a ½ PASR operation, the period "T" of the refresh cycle is doubled (2T) in order to reducing current dissipation. In other words, in the exemplary embodiment of FIG. 15a, since only 2047 wordlines need to be activated ($2^{10}$), the period "T" of the refresh signal PSELF is doubled. The period "T" of the refresh signal is adjusted in response to the signal IN2. FIG. 19 is a schematic diagram of a PSELF generator according to an embodiment of the present invention. The PSELF generator 1603 comprises an n-bit counter, wherein the amount of cycle counters (1603-1 to 1603-4) that are used to generate the PSELF signal changes based on the signal IN2.

More specifically, in the case of a full array self-refresh operation for a selected memory bank, a predetermined number of cycle counters are used (1603-1 to 1603-3) to generate the QN or PSELF signal output from counterN 1603-3. In response to IN2 of a logic "high" level, the POSC signal is switched directly to counter0 1603-1 via a switching mechanism 1603-5, and the PSELF signal having period "T" is output from the PSELF generator 1603.

Figure 20:
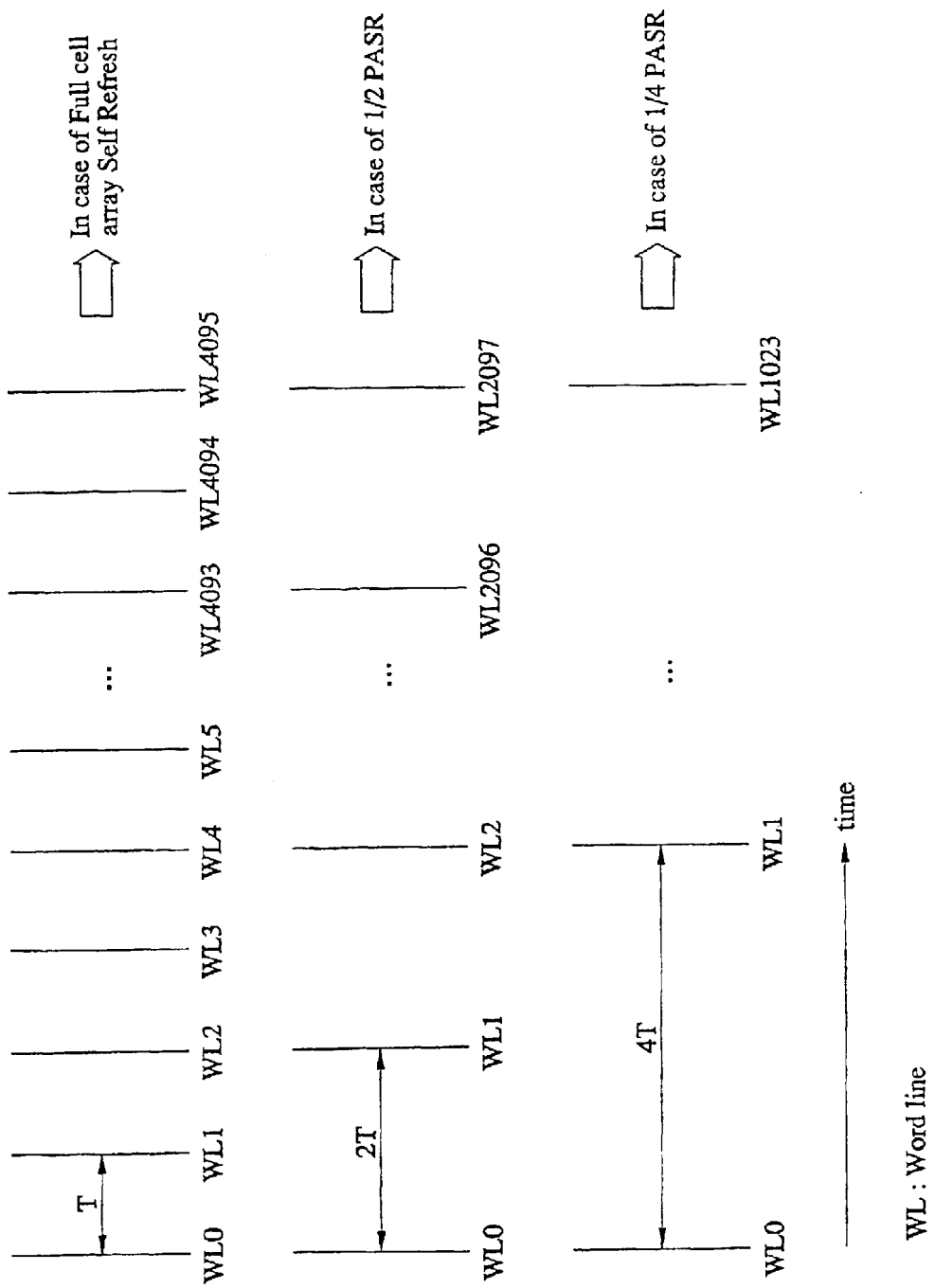
FIG. 20 is a diagram illustrating a method for adjusting word line activation intervals for performing a PASR operation according to the present invention.

Further, in the case of a PASR operation wherein the IN2 has a level of logic "low", the switch 1603-5 passes the POSC signal to an additional counter 1604-4, so that the period of the PSELF signal that is generated is twice the period (2T) of the predetermined self-refresh cycle for the full array self-refresh operation. For each additional counter used, the period T of PSELF is doubled. For instance, FIG. 20 is a diagram illustrating world line activation intervals for a full array self-refresh operation, a ½ PASR operation and a ¼ PASR operation. Thus, for the ¼ PASR operation, the use of two additional counters in the PSELF generator 1603 will cause the period of the PSELF signal to quadruple (4T) from the predetermined period T of the full array self-refresh operation.

Figure 21:
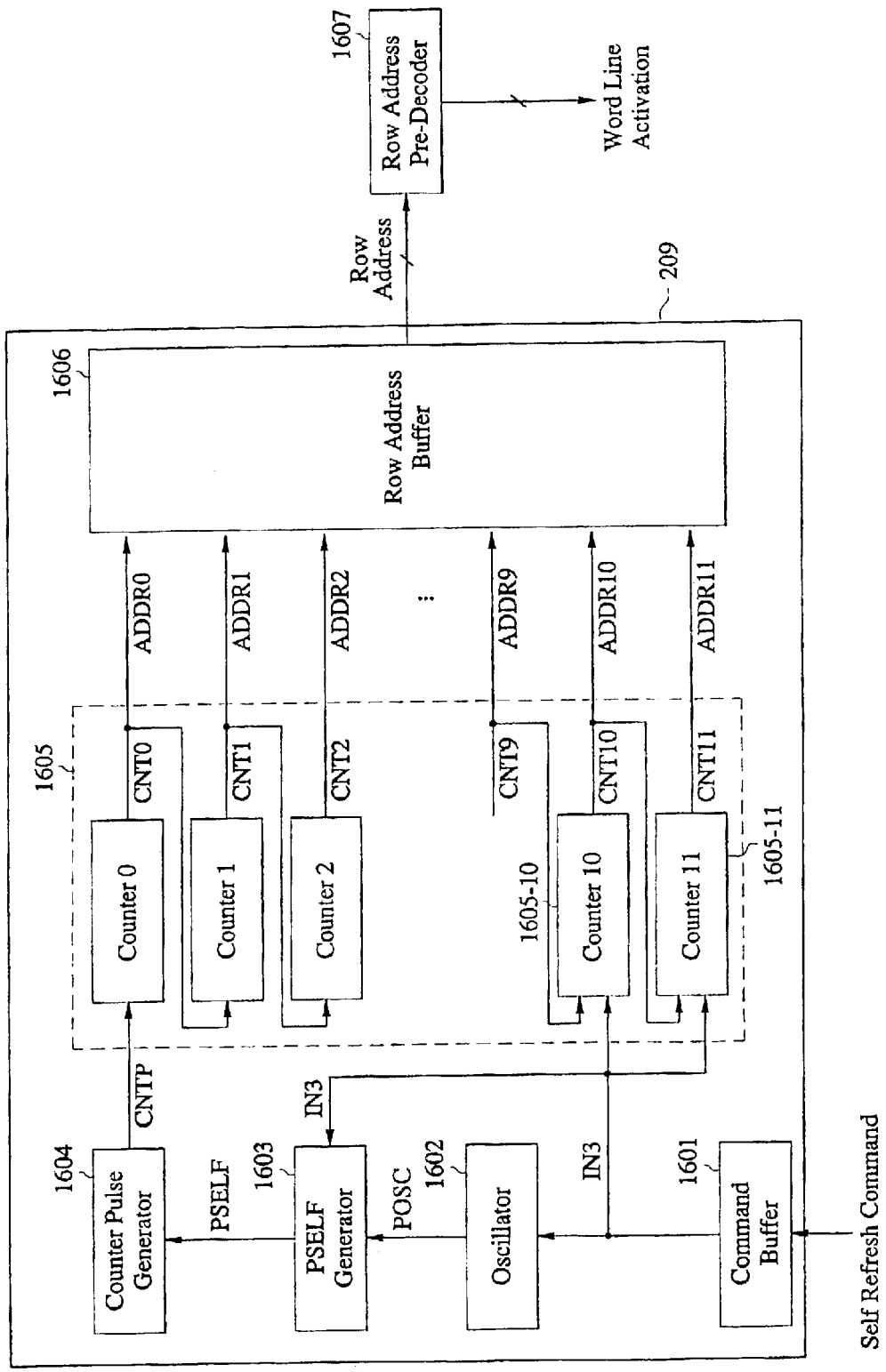
FIG. 21 is a schematic diagram of a circuit for performing a PASR operation according to another embodiment of the present invention.

FIG. 21 is a schematic of a circuit for performing PASR operation according to another embodiment of the present invention. The operation of the circuit of FIG. 21 is similar to the operation of the circuit of FIG. 16 as described above, except that counter10 1605-10 and counter11 1605-11 are selectively disabled/enabled by a control signal IN3 which is input to the PSELF generator for controlling the self-refresh interval. By selectively disabling both cycle counter10 and cycle counter11 via control signal IN3, address bits CNT10 and CNT11 can respectively be masked and fixed to desired levels, so as to perform a ¼ PASR operation.

Figure 22:
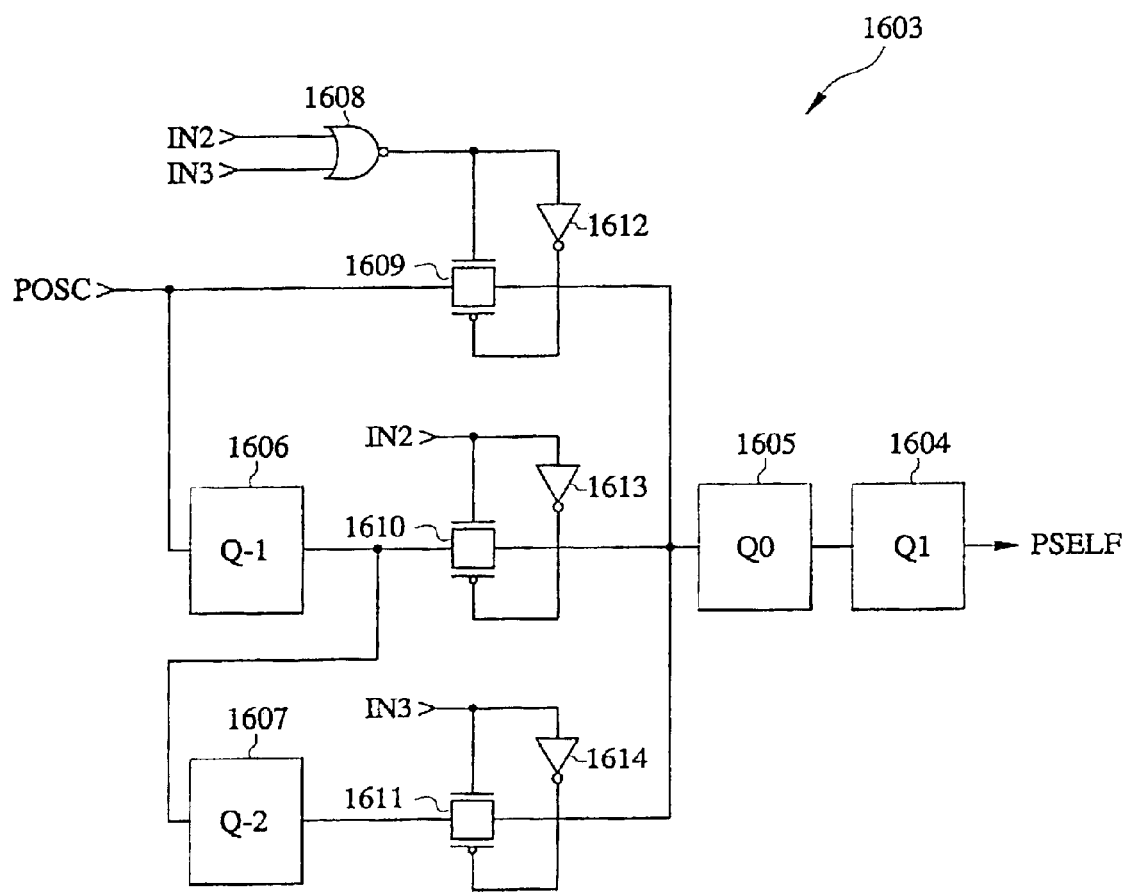
FIG. 22 is a circuit diagram of a self-refresh cycle generator according to another embodiment of the present invention.

FIG. 22 illustrates an embodiment of a self-refresh cycle generating circuit 1603 according to the present invention, in which a refresh cycle is selectively controlled by control signals IN2 and IN3 to double or quadruple the predetermined self-refresh cycle "T". The circuit comprises a plurality of cycle counters 1604, 1605, 1606 and 1607, a NOR gate 1608, a plurality of transfer gates 1609, 1610, 1611, and a plurality of inverter buffers 1612, 1613, 1614, all of which are operatively connected as shown. The control signal 1N2 is used to enable a ½ PASR operation and the control signal IN3 is used to enable a ¼ PASR operation. Depending on the logic levels of the control signals IN2 and IN3, the path of the oscillator signal POSC will vary to obtain the desired PSELF signal output from the Q1 cycle counter 1604.

More specifically, assume that the output of cycle counter 1604 is the output that determines a current cycle. In one embodiment, in case of a full array self-refresh operation, the signals IN2 and IN3 are fixed to have a logic "low" level. The transfer gate 1609 is activated and the transfer gates 1610 and 1611 are not activated, which causes the signal POSC to pass through cycle counters 1605 and 1604 to generate a PSELF signal having period "T" (as shown in the timing diagram of FIG. 23a). In case of ½ PASR operation, the signals IN2 and IN3 are fixed to have a logic "high" level and a logic "low" level, respectively. As a result, transfer gates 1609 and 1611 are not activated and the POSC signal passes through cycle counters 1606, 1605 and 1604. The output of counter 1604 (PSELF) has a period that is twice the period of the PSELF for the full array self-refresh (as shown in the timing diagram of FIG. 23b). Further, in case of a ¼ PASR operation, the signals IN2 and IN3 are fixed to have a logic "low" level and a logic "high" level, respectively, which results in transfer gate 1611 being activated and transfer gates 1609 and 1610 not being activated. The POSC signal therefor passes through all of the cycle counters 1606, 1607, 1605 and 1604. The output signal of counter 1604 will thus have a period that four times the predetermined period "T" for the full array self-refresh (as illustrated in the timing diagram of FIG. 23c).

Figure 24A:
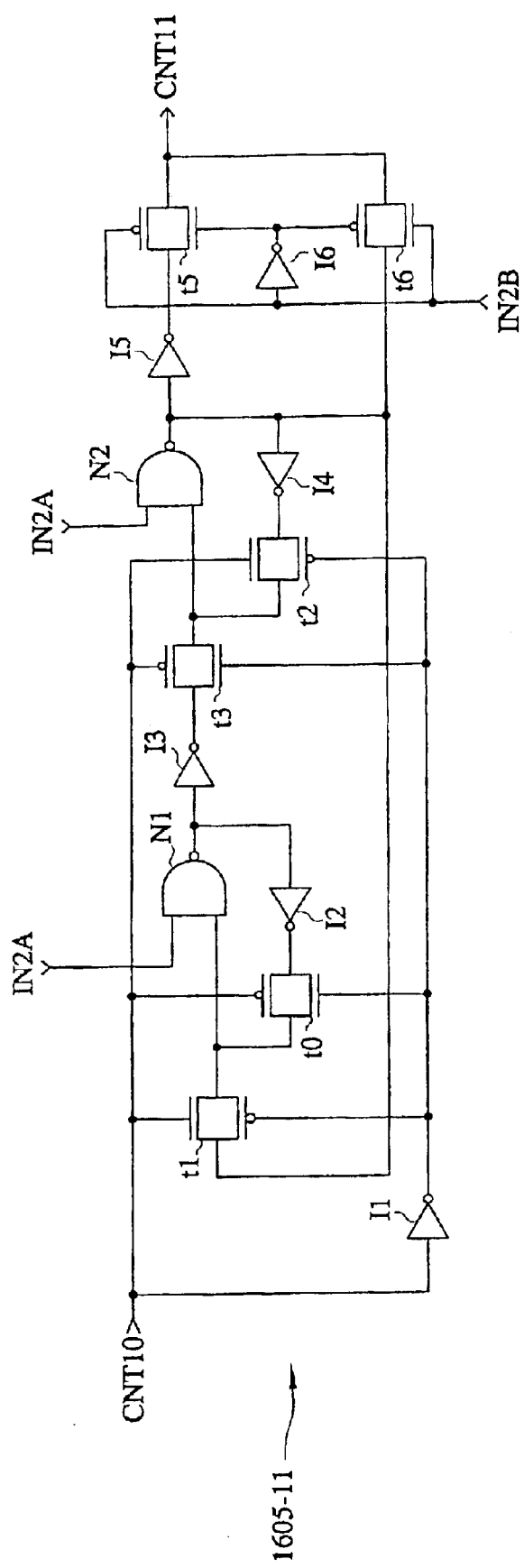
FIGS. 24(a) and 24(b) are circuit diagrams of cycle counters according to other embodiments of the present invention for performing a PASR operation.
Figure 24B:
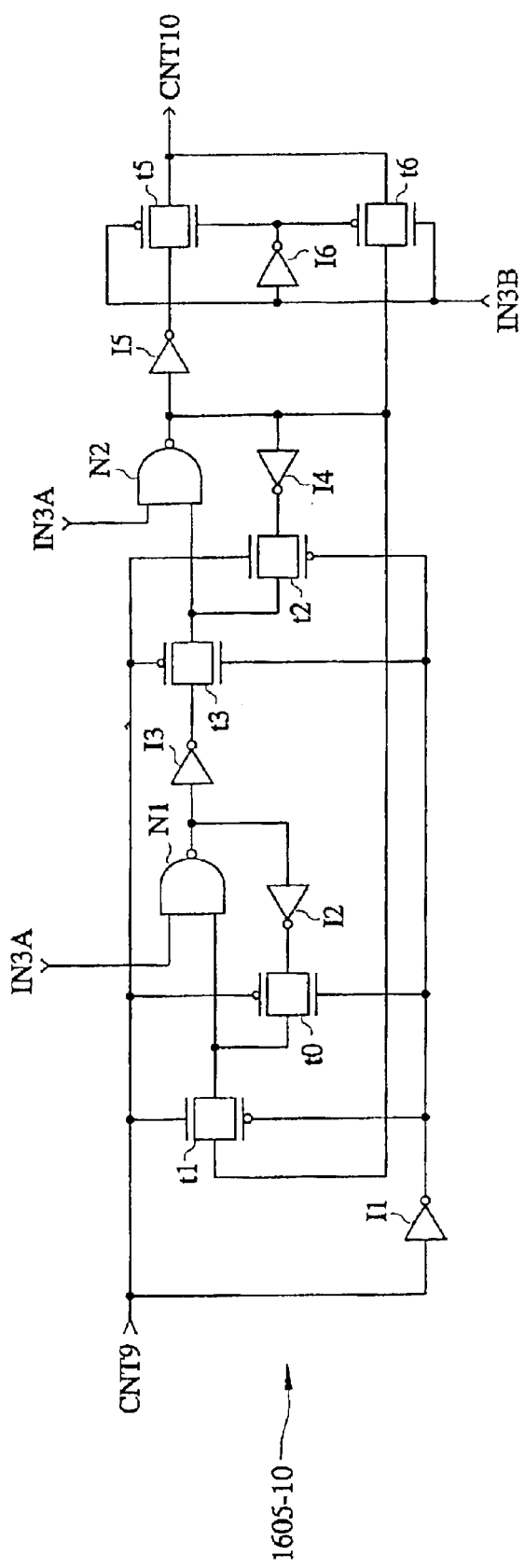

FIGS. 24(a) and 24(b) are schematic diagrams illustrating cycle counters according to another embodiment of the present invention. In particular, FIGS. 24(a) and 24(b) illustrate embodiments for cycle counters 1605-11 and 1605-10 that can be implemented in the counter 1605 of diagram 21 for providing, e.g., a ¼ PASR operation, according to an embodiment of the present invention. The exemplary cycle counters shown in FIGS. 24(a) and 24(b) are similar to the cycle counter illustrated in FIG. 18(a), except for the inclusion of buffer inverter 16, and transfer gates t5 and t6, which are operatively connected as shown. In addition, the control signals IN2 and IN3 each comprise a two bit signal, IN2A, IN2B and IN3A, IN3B, respectively, for providing various outputs of counter bits CNT11 and CNT10, which in turn provide various outputs of the address bits 10 and 11 for selecting a block of memory of a selected memory bank. For instance, in one embodiment, one of Blocks 1–4 of selected memory bank are refreshed based on a ¼ PASR operation in accordance with the following table:

| IN3<br>IN3B/IN3A | IN2<br>IN2B/IN2A | Block |
| --- | --- | --- |
| L/L | L/L | 1 |
| H/L | L/L | 2 |
| L/L | H/L | 3 |
| H/L | H/L | 4 |

In accordance with another embodiment of the present invention, a second control method for performing a PASR operation is one which controls not a corresponding row address counter, but rather a row address corresponding to a partial cell array of the row address, and blocks an activation of non-used blocks of a selected memory bank. For instance, referring again to FIG. 15a, cell data are amplified in connection with a self-refresh counter in Block1. In Block2, even though the self-refresh counter is enabled, an activation is blocked in a manner that controls not a self-refresh address counter but an address. Blocking the activation is performed by blocking a row address applied to a row address buffer or decoder.

Figure 25:
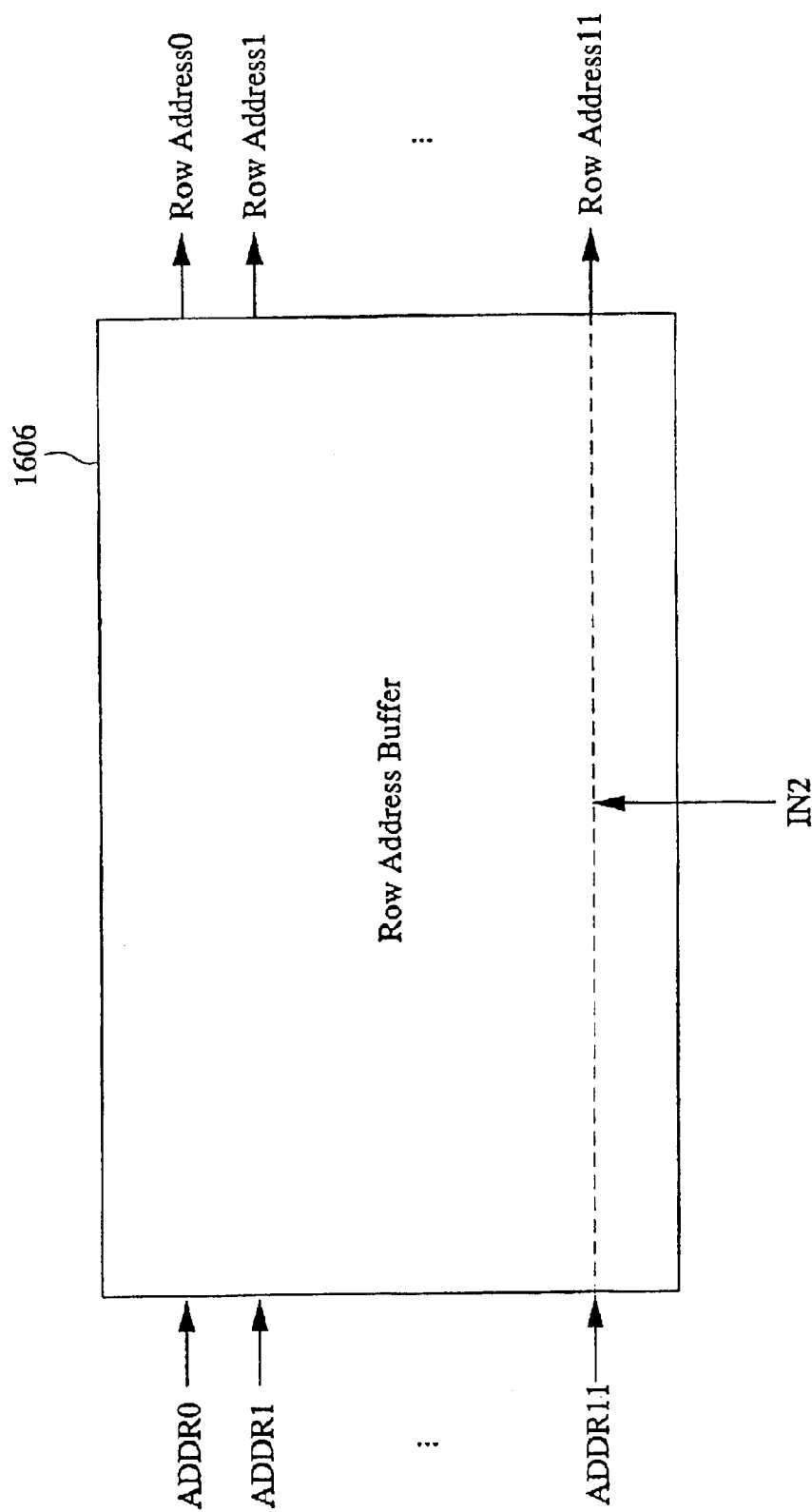
FIG. 25 is a schematic diagram of a row address buffer according to an embodiment of the present invention for performing a PASR operation.

FIG. 25 is a schematic diagram of the row address buffer 1606 illustrating a method of blocking an activation of a row address via the row address buffer. As illustrated, address bit ADDR11, which is output from the counter 1605 (FIG. 16) is masked by the signal IN2, so that Row Address 11 is maintained at logic level "low". Therefore, Block 1 in FIG. 15a is selected.

Figure 26:
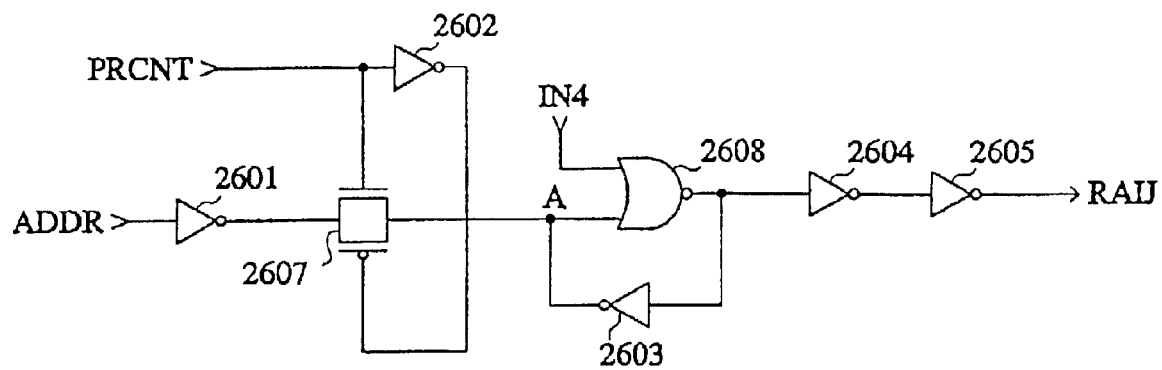
FIG. 26 is a circuit diagram of a portion of a row address buffer according to an embodiment of the present invention for performing a PASR operation.

FIG. 26 is a schematic diagram of a portion of row address buffer according to another embodiment of the present invention which illustrates another method for blocking activation of an address in the row address buffer. The circuit comprises a plurality of inverters 2601–2605, transfer gate 2607 and nor gate 2608. An address bit (e.g. ADDR11) is applied to inverter 2601. A signal IN4 comprises a PASR control signal that is applied to one input of the NOR gate 2608 and signal PRCNT comprises a signal which is enabled during a refresh operation and which is applied to transfer gate 2607 and inverter 2602. When the signal PRCNT is enabled to become a logic "high" level, the transmission gate 2607 transfers the row address ADDR generated from a self-refresh counter 1605 (in FIG. 16, for example) to node A. At this time, if a signal IN4 is fixed to have a logic "low" level, a signal of the node A is outputted through NOR gate as an internal row address signal RA1J. Therefore, a full array self-refresh operation is performed. On the other hand, if the signal IN4 is fixed to have a logic "high" level, the output signal RA1J is maintained at a logic "low" level. Accordingly, a PASR operation is performed.

Figure 27:
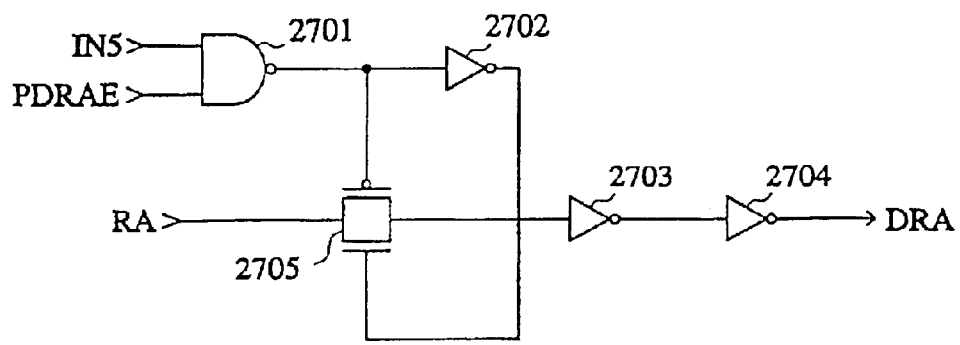
FIG. 27 is a circuit diagram of a portion of a row pre-decoder according to an embodiment of the present invention for performing a PASR operation.

In another embodiment of the present invention, blocking activation of a row address of non-used blocks of a selected memory bank is performed by blocking a row address applied to a row address pre-decoder 1607. FIG. 27 is a schematic diagram of a row address decoder for blocking activation of a row address. The circuit comprises a NAND gate 2701, a plurality of inverters 2702–2704 and a transfer gate 2705, all of which are operatively connected as shown. A signal PDRAE is a signal that enables the row decoder and control signal IN5 is a PASR control signal. In case of a full array self-refresh operation, if the signals PDRAE and IN5 are each fixed to a logic "high" level, a row address signal RA is transferred through transmission gate 2705 and output as refresh address DRA. On the other hand, in case of a PASR operation, if signal PDRAE is fixed to a logic "high" level and the control signal IN5 is fixed to have a logic "low" level, the signal RA is blocked. Therefore, a PASR operation is performed.

Although this invention has been particularly shown and described with references to preferred embodiments thereof, it will be understood by those skilled in the art that various changes in form and detail may be made herein without departing from the spirit and scope of the invention as defined by the appended claims.

What is claimed is:

1. A memory device, comprising:
   a plurality of memory banks, wherein each memory bank is divided into a plurality of memory blocks; and
   a self-refresh controlling circuit for selecting a memory bank and performing a self-refresh operation of less than all of the memory blocks of the selected bank,
   wherein the self-refresh controlling circuit performs a self-refresh operation of less than all of the memory blocks of the selected bank by (i) masking a self-refresh address bit and (ii) adjusting a period T of a self-refresh cycle, and
   wherein the self-refresh is performed for $$\frac{1}{2^n} \text{ (where } n = 1, 2, 3, \ldots)$$

of the memory blocks of the selected bank, and wherein the period T of the self-refresh cycle is adjusted to $2^n$T.

2. A memory device, comprising:
   a plurality of memory banks, wherein each memory bank is divided into a plurality of memory blocks; and
   a self-refresh controlling circuit for selecting a memory bank and performing a self-refresh operation of less than all of the memory blocks of the selected bank,
   wherein the self-refresh controlling circuit comprises:
   a self-refresh address counter for generating row address data;
   a self-refresh cycle generating circuit for generating a self-refresh cycle signal;
   wherein the self-refresh address counter is responsive to a self-refresh command signal to mask one or more bits of the address data, and wherein the self-refresh cycle generating circuit is responsive to the self-refresh command signal to increase the period of the self-refresh cycle signal.

3. A method for performing a self-refresh operation in a semiconductor memory device, comprising the steps of:
   selecting a memory bank, wherein the memory bank is divided into a plurality of memory blocks; and
   performing a self-refresh operation of less than all of the memory blocks of the selected bank, wherein self-refresh is performed for $$\frac{1}{2^n} \text{ (where } n = 1, 2, 3, \ldots)$$

of the memory blocks of the selected bank, and wherein the period T of the self-refresh cycle is adjusted to $2^n$T.

4. The method of claim 3, wherein the step of performing a self-refresh operation comprises the steps of:
   masking a self-refresh address bit; and
   adjusting a period T of a self-refresh cycle.

* * * * *